(12) United States Patent
Ishida et al.

(10) Patent No.: US 8,811,441 B2
(45) Date of Patent: Aug. 19, 2014

(54) LASER DRIVING DEVICE, OPTICAL SCANNING DEVICE, IMAGE FORMING APPARATUS, AND LASER DRIVING METHOD

(75) Inventors: Masaaki Ishida, Kanagawa (JP); Atsufumi Omori, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 766 days.

(21) Appl. No.: 13/024,572

(22) Filed: Feb. 10, 2011

(65) Prior Publication Data

US 2011/0199657 A1    Aug. 18, 2011

(30) Foreign Application Priority Data

Feb. 18, 2010    (JP) .................. 2010-033088

(51) Int. Cl.
    *H01S 3/00*    (2006.01)
(52) U.S. Cl.
    USPC .................. 372/38.02; 382/38.01; 382/38.07
(58) Field of Classification Search
    CPC ..... H01S 5/0428; H01S 5/0427; H01S 5/042; H01S 3/1305
    USPC ................. 372/38.02, 38.01, 38.07
    See application file for complete search history.

(56) References Cited

U.S. PATENT DOCUMENTS

| | | | |
|---|---|---|---|
| 6,791,596 B2 | 9/2004 | Nihei et al. | |
| 6,927,789 B2 | 8/2005 | Ozasa et al. | |
| 6,933,957 B2 | 8/2005 | Omori et al. | |
| 7,212,224 B2 | 5/2007 | Nihei et a | |
| 7,256,815 B2 | 8/2007 | Suzuki et al. | |
| 7,271,824 B2 | 9/2007 | Omori et al. | |
| 7,283,151 B2 | 10/2007 | Nihei et al. | |
| 7,327,379 B2 | 2/2008 | Nihei et al. | |
| 7,463,278 B2 | 12/2008 | Ozasa et al. | |
| 7,515,170 B2 | 4/2009 | Omori et al. | |
| 7,697,583 B2 * | 4/2010 | Furukawa et al. | 372/38.02 |
| 7,701,480 B2 | 4/2010 | Omori et al. | |
| 7,826,110 B2 | 11/2010 | Tanabe et al. | |
| 7,834,902 B2 | 11/2010 | Nihei et al. | |
| 2003/0035451 A1 * | 2/2003 | Ishida et al. | 372/38.02 |
| 2005/0089069 A1 | 4/2005 | Ozasa et al. | |
| 2005/0219354 A1 | 10/2005 | Omori et al. | |
| 2006/0285186 A1 | 12/2006 | Ishida et al. | |

(Continued)

FOREIGN PATENT DOCUMENTS

| | | |
|---|---|---|
| JP | 4-283978 | 10/1992 |
| JP | 5-328071 | 12/1993 |

(Continued)

OTHER PUBLICATIONS

Japanese Office Action issued Sep. 30, 2013, in Japan Patent Application No. 2010-033088.

*Primary Examiner* — Kinam Park

(74) *Attorney, Agent, or Firm* — Oblon, Spivak, McClelland, Maier & Neustadt, L.L.P.

(57) ABSTRACT

A laser driving device that drives a semiconductor laser based on a light-emitting signal includes an expansion circuit that expands a pulse width of the light-emitting signal based on a known difference between the pulse width of the light-emitting signal and a lighting pulse width of the semiconductor laser when the semiconductor laser emits light according to the light-emitting signal, and a driver that outputs a driving signal to the semiconductor laser according to an output signal of the expansion circuit.

15 Claims, 16 Drawing Sheets

(56) References Cited

U.S. PATENT DOCUMENTS

| | | |
|---|---|---|
| 2007/0030548 A1 | 2/2007 | Nihei et al. |
| 2007/0132828 A1 | 6/2007 | Ishida et al. |
| 2007/0242127 A1 | 10/2007 | Omori et al. |
| 2008/0012933 A1 | 1/2008 | Nihei et al. |
| 2008/0042700 A1 | 2/2008 | Nihei et al. |
| 2008/0088893 A1 | 4/2008 | Ishida et al. |
| 2008/0123160 A1 | 5/2008 | Omori et al. |
| 2008/0239336 A1 | 10/2008 | Tanabe et al. |
| 2008/0267663 A1 | 10/2008 | Ichii et al. |
| 2008/0291259 A1 | 11/2008 | Nihei et al. |
| 2008/0298842 A1 | 12/2008 | Ishida et al. |
| 2009/0091805 A1 | 4/2009 | Tanabe et al. |
| 2009/0167837 A1 | 7/2009 | Ishida et al. |
| 2009/0174915 A1 | 7/2009 | Nihei et al. |
| 2009/0195635 A1 | 8/2009 | Ishida et al. |
| 2009/0231656 A1 | 9/2009 | Suzuki et al. |
| 2009/0303451 A1 | 12/2009 | Miyake et al. |
| 2010/0045767 A1 | 2/2010 | Nihei et al. |
| 2010/0119262 A1 | 5/2010 | Omori et al. |
| 2010/0214637 A1 | 8/2010 | Nihei et al. |

FOREIGN PATENT DOCUMENTS

| | | |
|---|---|---|
| JP | 9-83050 | 3/1997 |
| JP | 11-78117 | 3/1999 |
| JP | 2001-158130 | 6/2001 |
| JP | 3466599 | 8/2003 |
| JP | 2006-41181 | 2/2006 |
| JP | 2009-152553 | 7/2009 |
| JP | 2010-2866 | 1/2010 |

\* cited by examiner

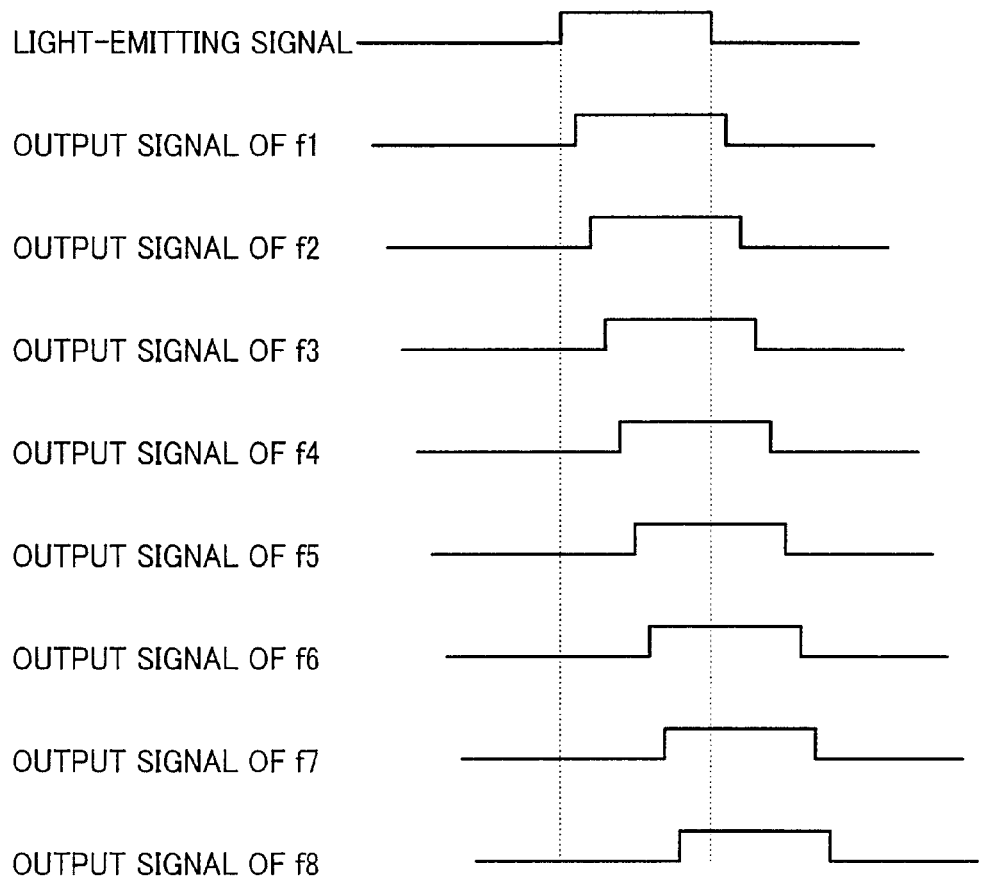

| $I_{LD}$ (mA) | $V_{LDDOWN}$ (V) | P [μW] |
|---|---|---|
| 0.00 | 0.000 | 0.018 |
| 0.25 | 1.437 | 0.250 |
| 0.50 | 1.471 | 0.560 |
| 0.75 | 1.492 | 0.900 |
| 1.00 | 1.507 | 1.260 |
| 1.50 | 1.529 | 2.020 |
| 2.00 | 1.545 | 2.830 |
| 3.00 | 1.568 | 4.520 |
| 4.00 | 1.585 | 6.400 |
| 5.00 | 1.598 | 8.330 |

LASER DRIVING DEVICE, OPTICAL SCANNING DEVICE, IMAGE FORMING APPARATUS, AND LASER DRIVING METHOD

CROSS-REFERENCE TO RELATED APPLICATIONS

The present application claims priority to and incorporates by reference the entire contents of Japanese Patent Application No. 2010-033088 filed in Japan on Feb. 18, 2010.

BACKGROUND OF THE INVENTION

1. Field of the Invention

The present invention relates to a laser driving device, an optical scanning device, an image forming apparatus, and a laser driving method, and more particularly relates to a laser driving device that drives a semiconductor laser, an optical scanning device that includes the laser driving device, an image forming apparatus that includes the optical scanning device, and a laser driving method for driving a semiconductor laser.

2. Description of the Related Art

Methods for driving a semiconductor laser are generally classified into a zero bias method and a bias method. The zero bias method is a method in which a bias current of a semiconductor laser is set to zero and a current corresponding to an input signal is supplied to the semiconductor laser so as to emit light. The bias method is a method in which an oscillation threshold current of a semiconductor laser is set to a bias current that is constantly supplied, and a difference between a current corresponding to an input signal and the bias current is added to the semiconductor laser so as to emit light.

In an image forming field typified by laser printers and digital copying machines, high speed processing is rapidly developing. Also, in an optical communications field, a communication speed markedly increases to a higher speed.

When a semiconductor laser having a large oscillation threshold current is driven by the zero bias method, a light-emitting delay occurs because it takes a certain period of time to produce a carrier density capable of laser oscillation from time at which a driving current corresponding to an input signal is supplied to the semiconductor laser. In this case, if the semiconductor laser is forced to be turned on and off at high speed, even if a driving current corresponding to a desired lighting pulse width is supplied to the semiconductor laser, a practical lighting pulse width may be smaller than the desired pulse width.

On the other hand, when the semiconductor laser is driven by the bias method, the light-emitting delay is smaller than that of the zero bias method because a current corresponding to the oscillation threshold current is constantly supplied. In this case, however, the semiconductor laser constantly and slightly emits light (typically, 200 µW to 300 µW) due to the bias current even when no light emission is required. In optical communications, this constant light emission results in a lower extinction ratio, causing so called a background fog in an image forming apparatus. A light-emitting amount caused by the bias current is also called as an "offset light-emitting amount".

Accordingly, in the optical communications field, there have been proposals that the oscillation threshold current is supplied just before starting light emission. For example, refer to Japanese Patent Application Laid-open No. H4-283978 and Japanese Patent Application Laid-open No. H9-083050.

Recently, image forming apparatuses using a red laser having an oscillation wavelength of the 650-nm range or an ultra violet laser having an oscillation wavelength of the 400-nm range have been gradually in practical use for achieving higher resolution. Such semiconductor lasers have a characteristic that a time period taken for producing a carrier density capable of laser oscillation is longer than those of the conventional lasers having oscillation wavelengths of the 1.3-µm range, the 1.5-µm range, and the 780-nm range.

When a low density image is to be expressed by shortening a pulse width (e.g., less than a few nanoseconds), a light-emitting output does not reach a peak intensity of a light spot, so that there is a problem that the image is displayed with a density lower than the desired density and therefore the correct density cannot be expressed. In order to solve the problems, various proposals have been made.

For example, Japanese Patent Application Laid-open No. H5-328071 discloses a static latent image forming apparatus that superimposes a differentiated waveform (differentiated pulse) of an element driving signal that is applied to a light-emitting element on the element driving signal.

For another example, Japanese Patent No. 3466599 discloses a semiconductor laser driving circuit that drives a semiconductor laser with a summation current of four currents: a bias current, a driving current, a threshold current, and a driving auxiliary current.

The static latent image forming apparatus disclosed in Japanese Patent Application Laid-open No. H5-328071, however, has problems in that the semiconductor laser may be put at increased risk of destruction because the device cannot control a peak value of the differentiated pulse, and an ultra low density in an initial stage may be corrected but it is not always true that a subsequent tone expression is linearly increased because a time period taken for superimposing the differentiated pulse on the element driving signal depends on the differentiated waveform.

The semiconductor laser driving circuit disclosed in Japanese Patent No. 3466599 can form a light waveform as a nearly ideal square waveform, but a so-called "pulse width reduction" may occur in which a pulse width of a light waveform becomes smaller than a pulse width of an input signal, depending on setting values of the bias current and the oscillation threshold current.

As another method, it has been also proposed that the rising characteristic of a light output is improved by overshooting a light waveform at timing at which a semiconductor laser starts to emit light. However, the overshooting sometimes causes the semiconductor laser to emit light with a light amount exceeding a predetermined light amount (e.g., a rated light amount) depending on amplitude of the overshooting, resulting in the occurrence of problems of deterioration and a short life span of the semiconductor laser, for example.

SUMMARY OF THE INVENTION

It is an object of the present invention to at least partially solve the problems in the conventional technology.

According to an aspect of the present invention, there is provided a laser driving device that drives a semiconductor laser based on a light-emitting signal, the laser driving device including: an expansion circuit that expands a pulse width of the light-emitting signal based on a known difference between the pulse width of the light-emitting signal and a lighting pulse width of the semiconductor laser when the semiconductor laser emits light according to the light-emitting signal; and a driver that outputs a driving signal to the semiconductor laser according to an output signal of the expansion circuit.

According to another aspect of the present invention, there is provided an optical scanning device that scans a scan target surface with light, the optical scanning device including: a semiconductor laser; the laser driving device described above that drives the semiconductor laser; a deflector that deflects light from the semiconductor laser; and a scanning optical system that collects light deflected by the deflector on the scan target surface.

According to still another aspect of the present invention, there is provided an image forming apparatus including: at least one image carrier; and at least one optical scanning device described above that scans the at least one image carrier with light modulated according to image information.

According to still another aspect of the present invention, there is provided a laser driving method for driving a semiconductor laser based on a light-emitting signal, the laser driving method including: determining a difference between a pulse width of the light-emitting signal and a lighting pulse width of the semiconductor laser when the semiconductor laser emits light according to the light-emitting signal; expanding the pulse width of the light-emitting signal based on the difference; and outputting a driving signal to the semiconductor laser according to expanded light-emitting signal.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 9 is a timing chart explaining output signals of buffer circuits of the expansion circuit;

FIG. 10 is a table explaining a relationship between a selection signal and an output signal of a selector;

DETAILED DESCRIPTION OF THE PREFERRED EMBODIMENTS

Figure 1:
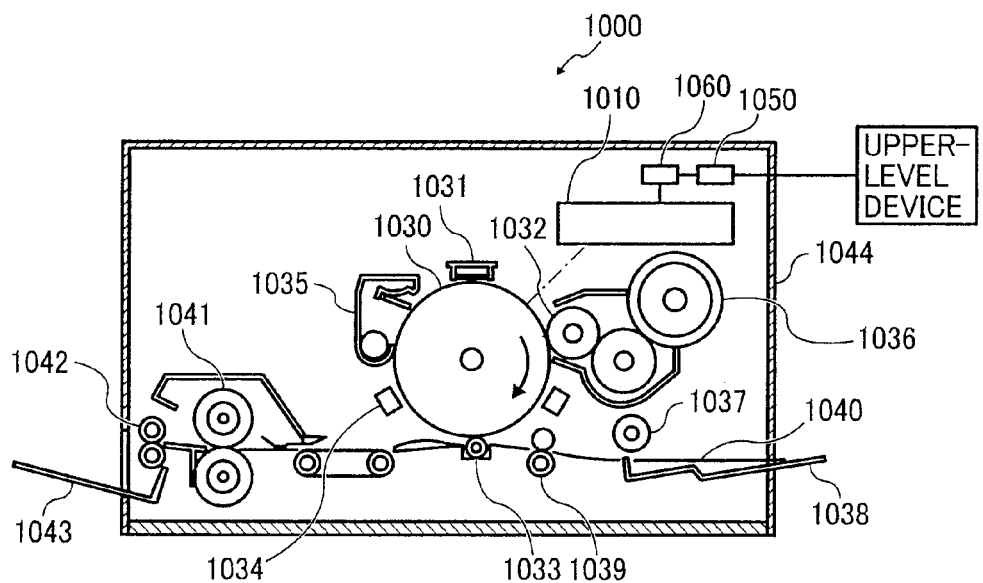
FIG. 1 is a schematic diagram explaining a schematic configuration of a laser printer according to an embodiment of the present invention.

An embodiment of the present invention is described with reference to FIGS. 1 to 27, below. FIG. 1 illustrates a schematic configuration of a laser printer 1000 according to the embodiment.

The laser printer 1000 includes an optical scanning device 1010, a photosensitive drum 1030, an electric charger 1031, a developing roller 1032, a transfer charger 1033, a neutralization unit 1034, a cleaning unit 1035, a toner cartridge 1036, a paper feeding roller 1037, a paper feed tray 1038, a pair of registration rollers 1039, a fixing roller 1041, a discharging roller 1042, a discharge tray 1043, a communication control device 1050, and a printer control device 1060 that overall controls the above described sections. They are housed at predetermined locations in a printer housing 1044.

The communication control device 1050 controls bidirectional communications with an upper-level device such as a personal computer through a network.

The photosensitive drum 1030 has a columnar shape and a photosensitive layer formed on its surface. In other words, the surface of the photosensitive drum 1030 serves as a surface to be scanned. The photosensitive drum 1030 rotates in a direction indicated by the arrow in FIG. 1.

The electric charger 1031, the developing roller 1032, the transfer charger 1033, the neutralization unit 1034, and the cleaning unit 1035 are arranged near the surface of the photosensitive drum 1030. The electric charger 1031, the developing roller 1032, the transfer charger 1033, the neutralization unit 1034, and the cleaning unit 1035 are arranged along the rotational direction of the photosensitive drum 1030 in this order.

The electric charger 1031 uniformly charges the surface of the photosensitive drum 1030.

The optical scanning device 1010 scans the surface of the photosensitive drum 1030 charged by the electric charger 1031 with light beams modulated based on image information from the upper-level device so as to form latent images corresponding to the image information on the surface of the photosensitive drum 1030. The formed latent images are moved toward the developing roller 1032 with the rotation of the photosensitive drum 1030. The configuration of the optical scanning device 1010 is described later.

Toner is stored in the toner cartridge 1036 and is supplied to the developing roller 1032.

The developing roller 1032 makes the toner supplied from the toner cartridge 1036 adhere to the latent image formed on the surface of the photosensitive drum 1030 to visualize the image information. The latent image to which the toner is adhered (hereinafter, also referred to as a "toner image" for convenience) moves in a direction of the transfer charger 1033 according to the rotation of the photosensitive drum 1030.

The paper feed tray 1038 stores therein a recording sheet 1040. The paper feeding roller 1037 is arranged near the paper feed tray 1038, takes out the recording sheet 1040 from the paper feed tray 1038 one by one, and conveys the sheet to the pair of registration rollers 1039. The pair of registration rollers 1039 once holds the recording sheet 1040 taken out by the paper feeding roller 1037 and sends out the recording sheet 1040 into the gap between the photosensitive drum 1030 and the transfer charger 1033 according to the rotation of the photosensitive drum 1030.

Voltage having a polarity opposite to that of the toner is applied to the transfer charger 1033 in order to electrically attract the toner on the surface of the photosensitive drum 1030 to the recording sheet 1040. The toner image on the surface of the photosensitive drum 1030 is transferred onto the recording sheet 1040 with this voltage. The recording sheet 1040 transferred in this process is sent to the fixing roller 1041.

The fixing roller 1041 applies heat and pressure onto the recording sheet 1040, and thus, the toner is fixed on the recording sheet 1040. The recording sheet 1040 fixed in this process is sent to the discharge tray 1043 via the discharging roller 1042 and is sequentially stacked on the discharge tray 1043.

The neutralization unit 1034 neutralizes the surface of the photosensitive drum 1030.

The cleaning unit 1035 removes the toner (residual toner) remaining on the surface of the photosensitive drum 1030. The surface of the photosensitive drum 1030 from which the residual toner is removed returns to a position facing the electric charger 1031 again.

The configuration of the optical scanning device 1010 is described below.

Figure 2:
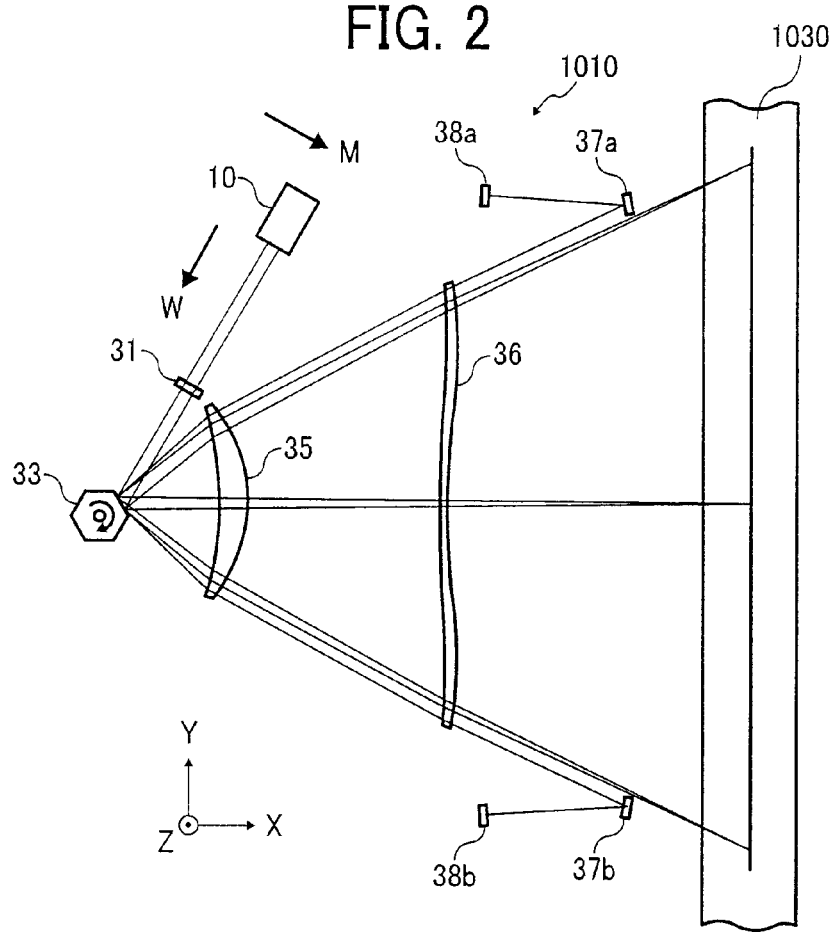
FIG. 2 is a schematic diagram illustrating an optical scanning device of FIG. 1.

The optical scanning device 1010 includes, as exemplarily illustrated in FIG. 2, a light source device 10, a cylindrical lens 31, a polygon mirror 33, a deflector side-scanning lens 35, an image surface side-scanning lens 36, two photodetection mirrors 37a and 37b, and two photodetection sensors 38a and 38b. They are assembled at predetermined locations of an optical housing (not illustrated).

In the present specification, a direction along the longitudinal direction of the photosensitive drum 1030 is referred to as a Y-axis direction while a direction along optical axes of the scanning lenses 35 and 36 is referred to as an X-axis direction based on an XYZ three-dimensional orthogonal coordinate system. In addition, the optical axis direction of the cylindrical lens 31 is referred to as a "W direction", and a direction orthogonal to both the Z-axis direction and the W direction is referred to as an "M direction".

Furthermore, a direction corresponding to a main-scanning direction is shortly referred to as a "main-scanning corresponding direction" while a direction corresponding to a sub-scanning direction is shortly referred to as a "sub-scanning corresponding direction" hereinafter for the sake of convenience.

Figure 3:
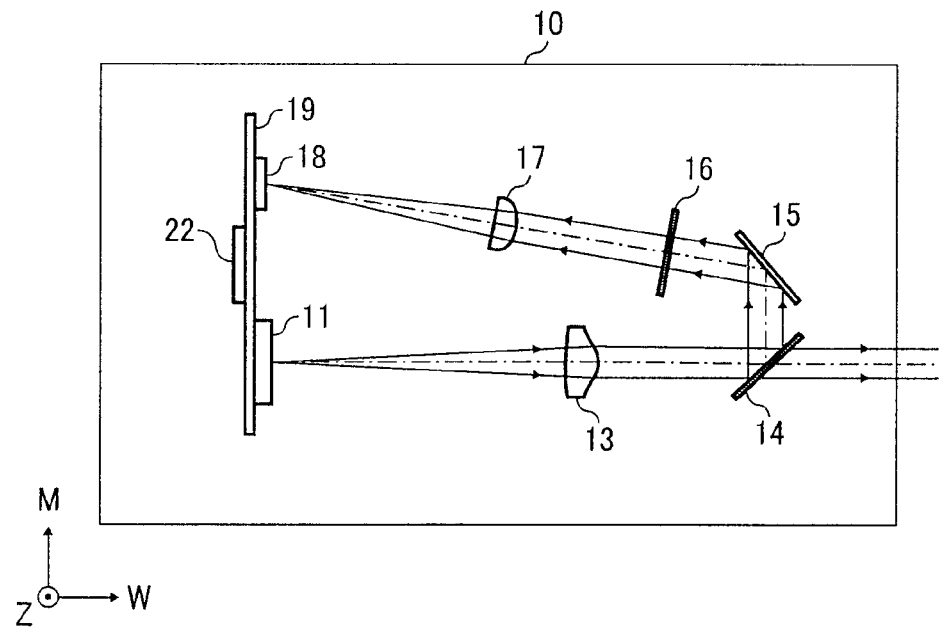
FIG. 3 is a schematic diagram explaining a light source device of FIG. 2.

The light source device 10 includes, as exemplarily illustrated in FIG. 3, a light source 11, a coupling lens 13, a first aperture plate 14, a monitor light reflection mirror 15, a second aperture plate 16, a collecting lens 17, a photoreceptor 18, and a light source control device 22. The light source 11, the photoreceptor 18, and the light source control device 22 are individually mounted on a circuit board 19. In the light source device 10, the main-scanning corresponding direction is a direction in parallel with the M direction while the sub-scanning corresponding direction is a direction in parallel with the Z-axis direction.

Figure 4:
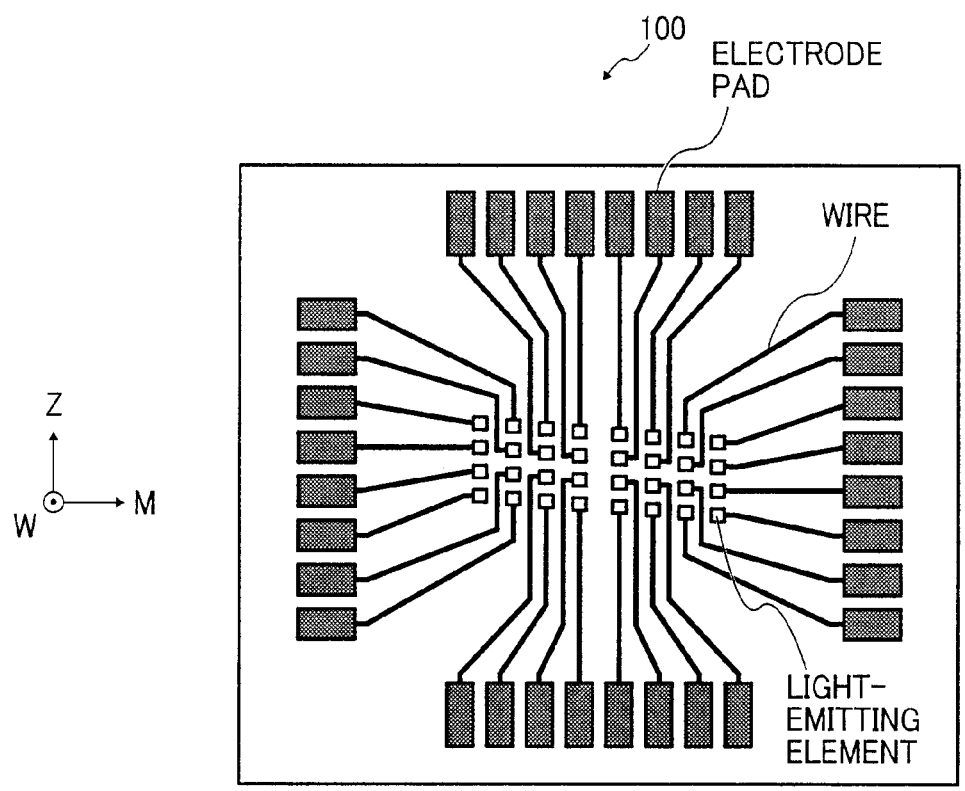
FIG. 4 is a schematic diagram explaining a laser chip included in a light source illustrated in FIG. 3.

The light source 11 includes a laser chip 100 as exemplarily illustrated in FIG. 4.

The laser chip 100 includes 32 light-emitting elements arrayed in a two dimensional fashion, and 32 electrode pads each of which corresponds to and is provided around one of the 32 light-emitting elements. Each electrode pad is electrically coupled to corresponding one of the light-emitting elements with a wiring member.

Figure 5:
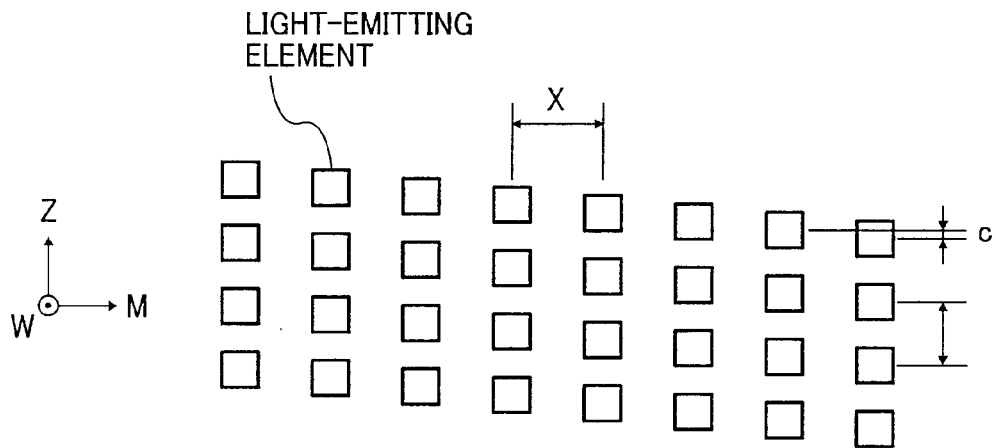
FIG. 5 is a schematic diagram explaining an array of a plurality of light-emitting elements of the laser chip.

The 32 light-emitting elements are arranged as illustrated in FIG. 5 in such a manner that light-emitting element intervals (in FIG. 5, "c") are equal to each other when all of the light-emitting elements are orthographically projected on virtual lines extending in the Z-axis direction. In the specification, the term "light-emitting element interval" means a center-to-center distance between two light-emitting elements.

In the embodiment, each light-emitting element is a vertical cavity surface emitting laser (VCSEL) having an oscillation wavelength in the 780-nm range. In other words, the laser chip 100 is a so-called surface emitting laser array chip.

The light source 11 is arranged so as to emit a light beam toward +W direction.

Referring back to FIG. 3, the coupling lens 13 renders a light beam emitted from the light source 11 a nearly parallel light beam.

The first aperture plate 14 has an opening portion and shapes a light beam after passing through the coupling lens 13. The first aperture plate 14 is arranged in such a manner that the highest light intensity part of a light beam after passing through the coupling lens 13 passes through nearly the center of the opening portion. In addition, the surrounding of the opening portion of the first aperture plate 14 is made of a reflective member having a high reflectance ratio.

The first aperture plate 14 is arranged so as to slant with respect to a virtual plane orthogonal to the optical axis of the coupling lens 13 for utilizing a light beam reflected by the reflective member provided around the opening portion as a monitor light beam.

The light beams passed through the aperture of the first aperture plate 14 mean light beams output from the light source device 10.

The monitor light reflection mirror 15 reflects the light beam (the monitor light beam) reflected by the reflective member of the first aperture plate 14 in a direction toward the photoreceptor 18.

The second aperture plate 16 specifies the beam diameter of the monitoring light beam reflected from the monitor light reflecting mirror 15. The size and the shape of the aperture of the second aperture plate 16 are determined depending on the size and the shape of the aperture of the first aperture plate 14.

The condensing lens 17 condenses the monitoring light beam passed through the aperture of the second aperture plate 16.

The photoreceptor 18 receives the monitoring light beam. The photoreceptor 18 outputs a signal (a photoelectric conversion signal) depending on the amount of received light.

The optical system arranged on the optical path for the monitoring light beam at a position between the first aperture plate 14 and the photoreceptor 18 is also called a monitoring optical system. In the present embodiment, the monitoring optical system is constituted by the monitor light reflecting mirror 15, the second aperture plate 16, and the condensing lens 17.

Referring back to FIG. 2, the cylindrical lens 31 makes the light beams passed through the aperture of the first aperture plate 14 of the light source device 10, that is, makes the light beams output from the light source device 10 form into an image near the deflection reflecting surface of the polygon mirror 33 in the Z-axis direction.

An optical system arranged on an optical path from the light source 11 to the polygon mirror 33 is also called as a pre-deflector optical system. In the embodiment, the pre-deflector optical system is composed of the coupling lens 13, the first aperture plate 14, and the cylindrical lens 31.

As an example, the polygon mirror 33 includes a six-sided mirror having an inscribed circle radius of 25 millimeters in which each mirror serves as a deflection reflecting surface. The polygon mirror 33 deflects the light beams from the cylindrical lens 31 while rotating at a constant speed around an axis parallel to the Z-axis direction.

The deflector side-scanning lens 35 is arranged on the optical path of the light beam deflected by the polygon mirror 33.

The image surface side-scanning lens 36 is arranged on the optical path of the light beam passed through the deflector side-scanning lens 35. The light beam passed through the image surface side-scanning lens 36 is emitted on the surface of the photosensitive drum 1030, and a light spot is formed thereon. The light spot moves in the longitudinal direction of the photosensitive drum 1030 according to the rotation of the polygon mirror 33. In other words, the light spot scans the photosensitive drum 1030. In this process, the movement direction of the light spot is a "main-scanning direction". The rotation direction of the photosensitive drum 1030 is a "sub-scanning direction".

The optical system arranged on the optical path at a position between the polygon mirror 33 and the photosensitive drum 1030 is also called a scanning optical system. In the present embodiment, the scanning optical system is constituted by the deflector side-scanning lens 35 and the image surface side-scanning lens 36. At least one reflecting mirror may be arranged on at least one of the optical path between the deflector side-scanning lens 35 and the image surface side-scanning lens 36 and the optical path between the image surface side-scanning lens 36 and the photosensitive drum 1030.

The photodetection sensor 38a receives, though the photodetection mirror 37a, part of a light beam that is deflected by the polygon mirror 33 and passes through the scanning optical system, and before writing in one scanning. The photodetection sensor 38b receives, though the photodetection mirror 37b, part of a light beam that is deflected by the polygon mirror 33 and passes through the scanning optical system, and after writing in one scanning.

Each of the photodetection sensors outputs a signal (a photoelectric conversion signal) depending on the amount of received light.

Figure 6:
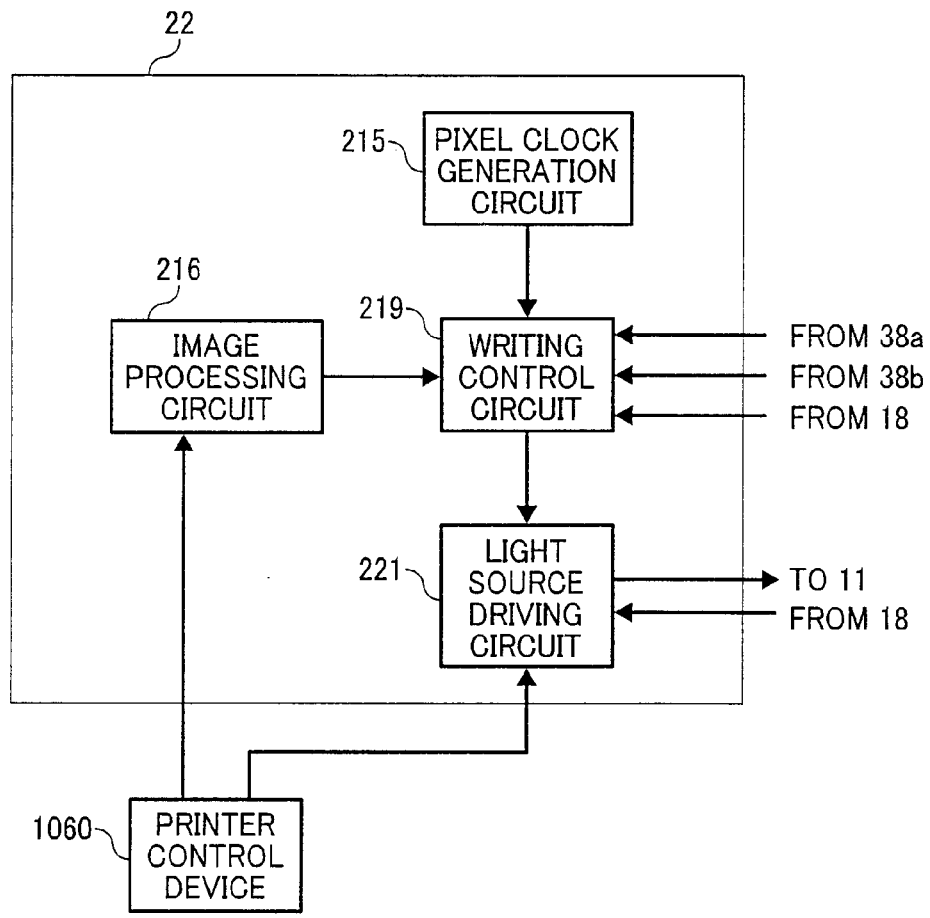
FIG. 6 is a block diagram explaining a configuration of a light source control device.

The light source control device 22 includes, as exemplarily illustrated in FIG. 6, a pixel clock generation circuit 215, an image processing circuit 216, a writing control circuit 219, and a light source driving circuit 221. In FIG. 6, the arrows illustrate flows of typical signals and information, but do not illustrate all of the connecting relationships among blocks. At least one of the pixel clock generation circuit 215 and the image processing circuit 216 may be provided so as to be isolated from the light source control device 22.

The pixel clock generation circuit 215 produces a pixel clock signal. The produced pixel clock signal is supplied to the writing control circuit 219.

The image processing circuit 216 rasterizes image information received from the upper-level device through the printer control device 1060, performs predetermined halftone processing and the like, and thereafter prepares image data representing each pixel tone for every light-emitting element.

Upon detecting a scanning start based on an output signal of the photodetection sensor 38a, the writing control circuit 219 takes in image data from the image processing circuit 216 in synchronization with the pixel clock signal, and produces a light-emitting signal.

The writing control circuit 219 determines a size of a pulse width reduction according to stray capacitance between the light source driving circuit 221 and the laser chip 100, and light-emitting properties of the laser chip 100, and produces a selection signal for correcting the pulse width reduction. The selection signal is output to the light source driving circuit 221.

The writing control circuit 219 outputs a light-emitting control signal corresponding to a current value supplied to the laser chip 100 when emitting light, to the light source driving circuit 221.

The writing control circuit 219 carries out auto power control (APC) based on an output signal of the photoreceptor 18. The writing control circuit 219 controls the light-emitting control signal based on the result of APC.

The writing control circuit 219 determines from output signals of the photodetection sensors 38a and 38b a time period taken for a light beam to scan from the photodetection sensor 38a to the photodetection sensor 38b, and corrects a pixel clock signal in such a manner that preset numbers of pulses are provided within the time period.

The light source driving circuit 221 drives each light-emitting element of the laser chip 100 based on a light-emitting signal from the writing control circuit 219.

Figure 7:
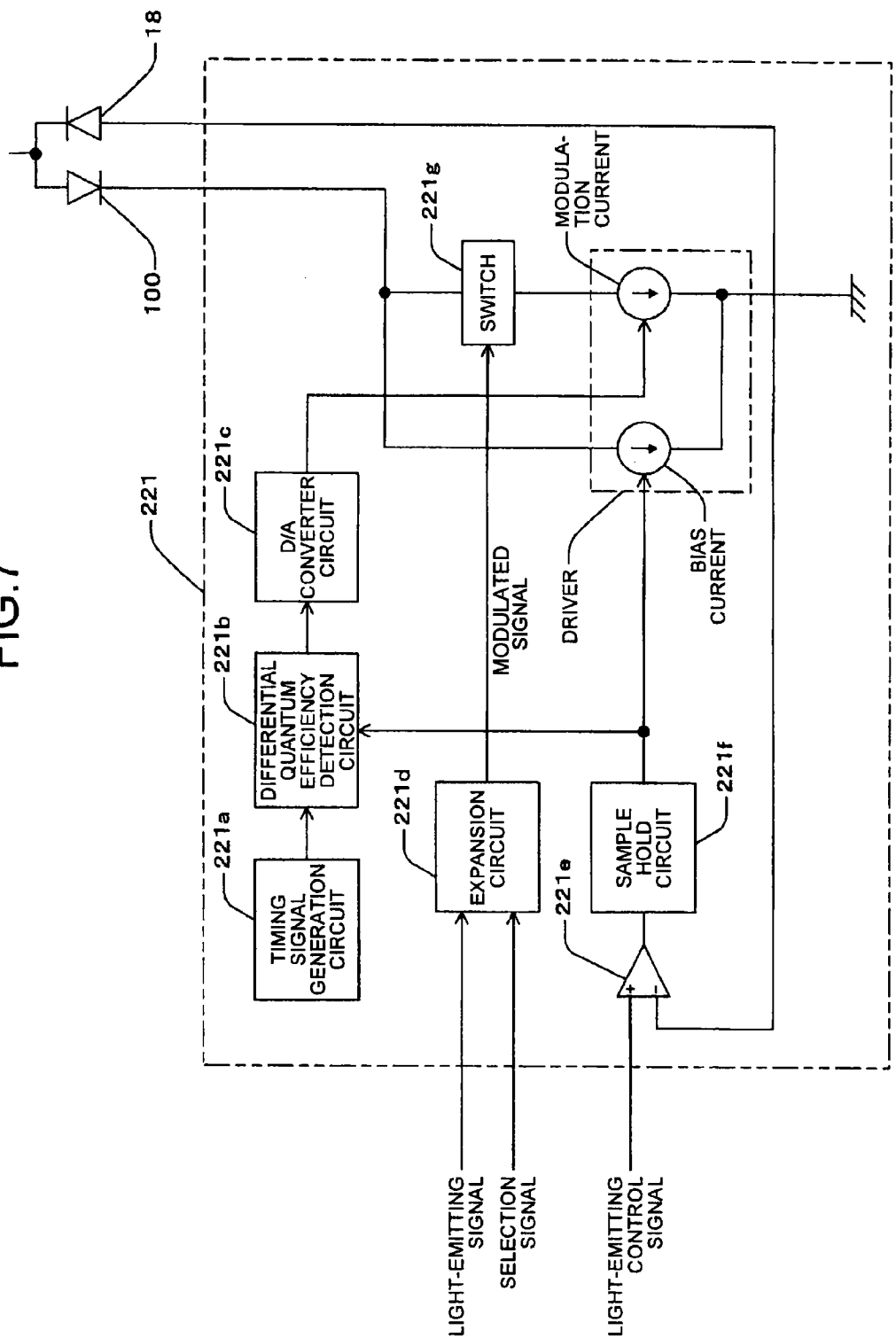
FIG. 7 is a schematic diagram explaining a configuration of a light source driving circuit of FIG. 6.

The light source driving circuit 221 includes, as exemplarily illustrated in FIG. 7, a timing signal generation circuit 221a, a differential quantum efficiency detection circuit 221b, a D/A converter circuit 221c, an expansion circuit 221d, a comparator 221e, a sample hold circuit 221f, and a switch 221g.

The timing signal generation circuit 221a produces a timing signal used in initialization processing carried out after power activation and resetting.

The differential quantum efficiency detection circuit 221b detects differential quantum efficiency based on the timing signal and an output signal of the sample hold circuit 221f.

The D/A converter circuit 221c converts an output signal (digital signal) of the differential quantum efficiency detection circuit 221b into an analog signal. A current value of a modulation current is determined according to the output signal of the D/A converter circuit 221c.

The comparator 221e compares the light-emitting control signal with an output signal of the photoreceptor 18 so as to output the comparison result.

The sample hold circuit 221f samples and holds the output signal of the comparator 221e. A current value of a bias current is adjusted according to the output signal of the sample hold circuit 221f. The output signal of the sample hold circuit 221f is also supplied to the differential quantum efficiency detection circuit 221b.

The expansion circuit 221d produces a modulated signal based on the light-emitting signal and the selection signal. The switch 221g is turned on or off by the output signal of the expansion circuit 221d.

When the switch 221g is in an off state, only a bias current is supplied to the light source 11, and when the switch 221g is in an on state, the bias current and a modulation current are supplied to the light source 11.

Figure 8:
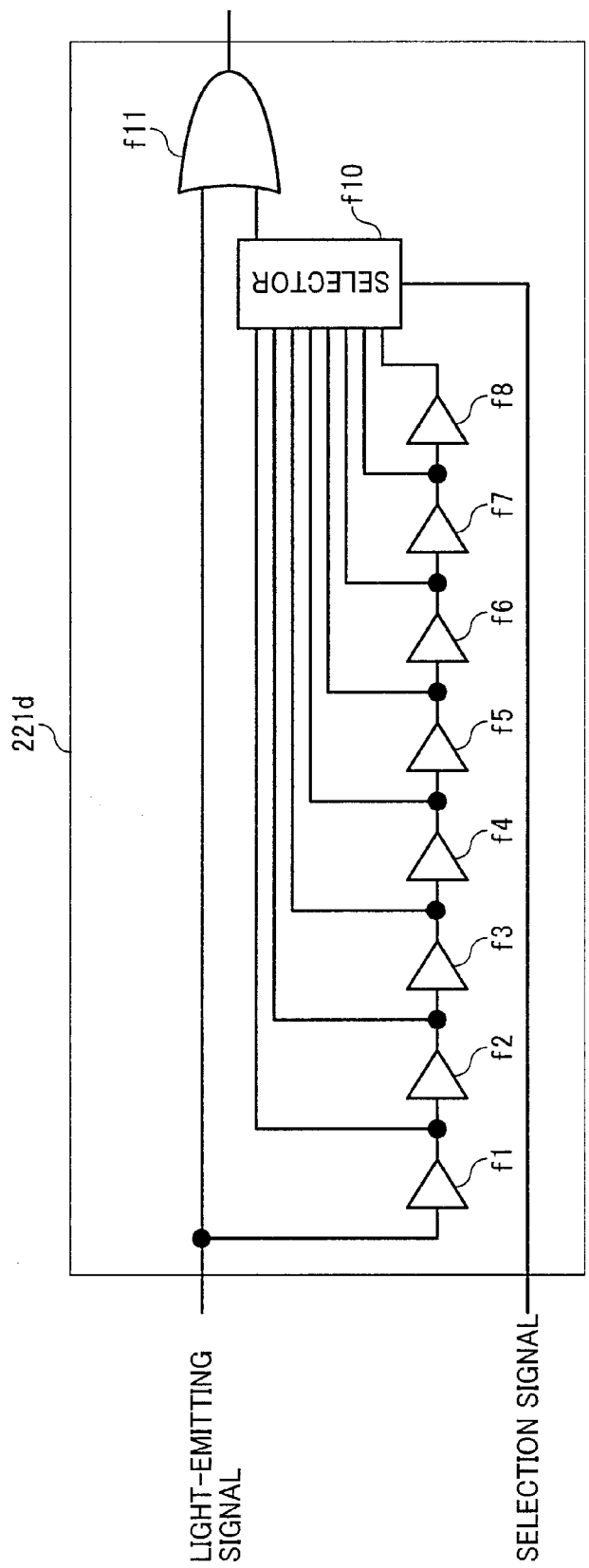
FIG. 8 is a schematic diagram explaining a configuration of an expansion circuit of FIG. 7.

The expansion circuit 221d includes, as exemplarily illustrated in FIG. 8, buffer circuits f1 to f8 of a plurality of stages (in this case, eight stages) to delay the light-emitting signal, a selector f10 that selects and outputs any one of outputs of the buffer circuits according to the selection signal, and an OR circuit f11 that outputs a logical addition of the light-emitting signal and the output signal of the selector f10. A signal delay amount in each buffer circuit is set according to characteristics of a laser and a circuit board on which the laser is mounted, and about from several hundred picoseconds to a few nanoseconds.

FIG. 9 illustrates a timing chart of a light-emitting signal input to the expansion circuit 221d, and signals output from the buffer circuits f1 to f8.

FIG. 10 illustrates the operation of the selector f10. In the embodiment, the selection signal includes three parallel signals. The three parallel signals are expressed, for example, as follows for the sake of convenience. When each signal level of the three parallel signals is a "low level", the signals are expressed as (000), and when each signal level of the three parallel signals is a "high level", the signals are expressed as (111).

When the selection signal is (000), the output signal of the selector f10 is a signal from the buffer circuit f1. When the selection signal is (001), the output signal of the selector f10 is a signal from the buffer circuit f2. When the selection signal is (010), the output signal of the selector f10 is a signal from the buffer circuit f3. When the selection signal is (011), the output signal of the selector f10 is a signal from the buffer circuit f4.

When the selection signal is (100), the output signal of the selector f10 is a signal from the buffer circuit f5. When the selection signal is (101), the output signal of the selector f10 is a signal from the buffer circuit f6. When the selection signal is (110), the output signal of the selector f10 is a signal from the buffer circuit f7. When the selection signal is (111), the output signal of the selector f10 is a signal from the buffer circuit f8.

Figure 11:
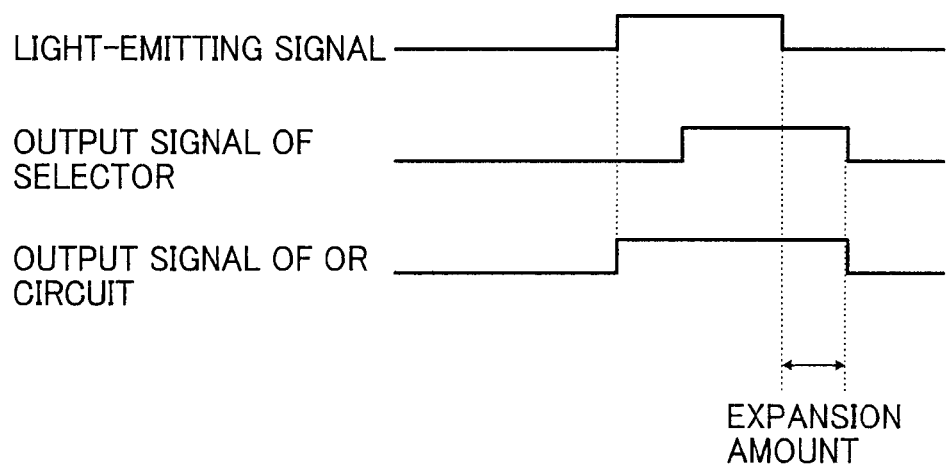
FIG. 11 is a timing chart explaining output signals of the selector and an OR circuit of the expansion circuit.

FIG. 11 illustrates a timing chart of the output signal of the selector f10 and the output signal of the OR circuit f11 when the selection signal is (011), as an example. In this case, the difference between the falling timing of the light-emitting signal and the falling timing of the output signal of the OR circuit f11 corresponds to an expansion amount.

Figure 12:
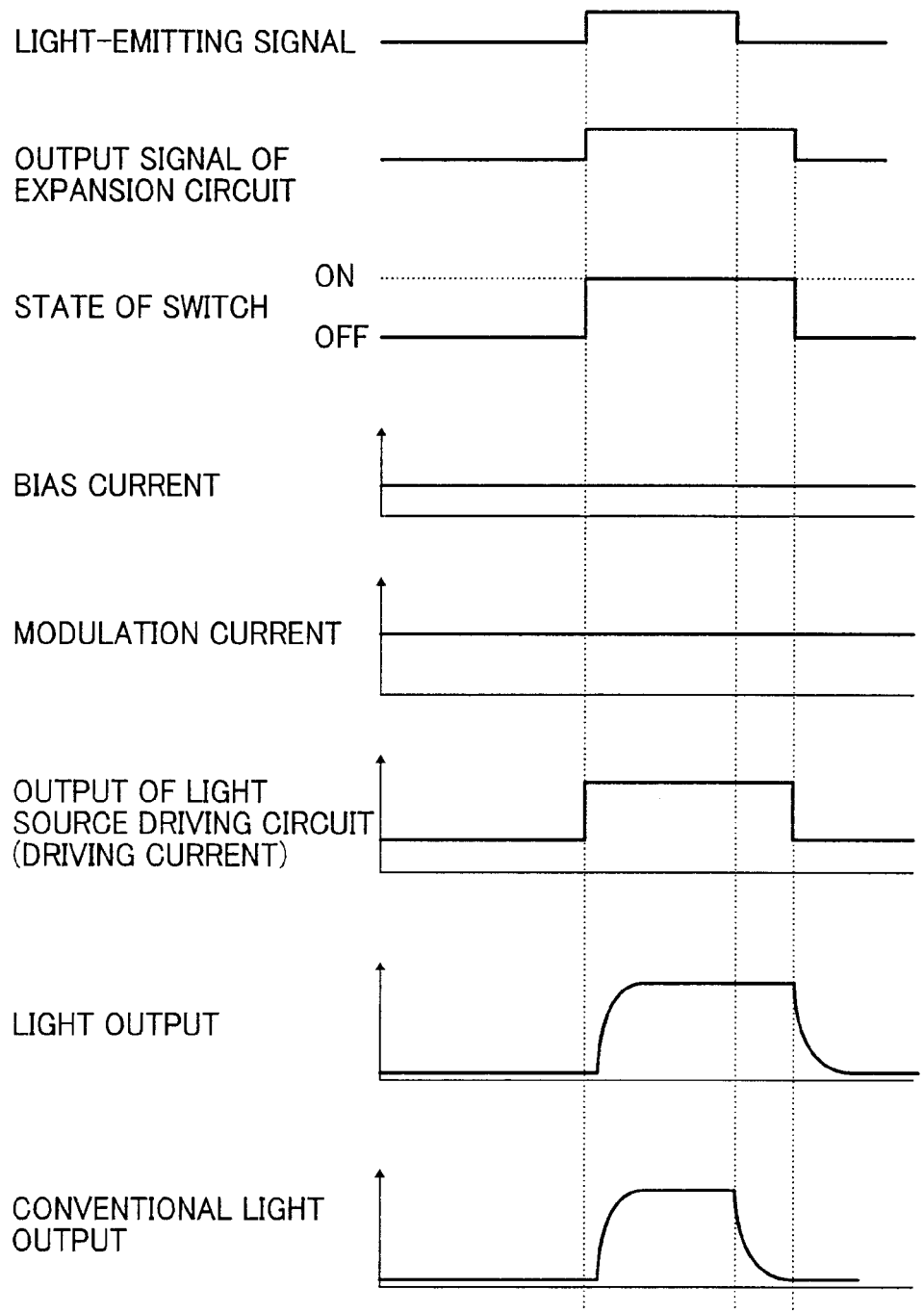
FIG. 12 is a timing chart explaining an output signal of the light source driving circuit.

FIG. 12 illustrates a timing chart of the state of the switch 221g and the output signal (a driving current) of the light source driving circuit 221 at this time.

FIG. 12 also illustrates a light waveform of light emitted from the light source at this time. FIG. 12 furthermore illustrates a light waveform (a conventional light waveform) of light emitted from a light source when a conventional light source driving circuit that supplies a driving current corresponding to a light-emitting signal to the light source is used. In the conventional light waveform, the pulse width reduction occurs.

In other words, the embodiment can prevent the occurrence of the pulse width reduction.

A bias current is described below.

Figure 13:
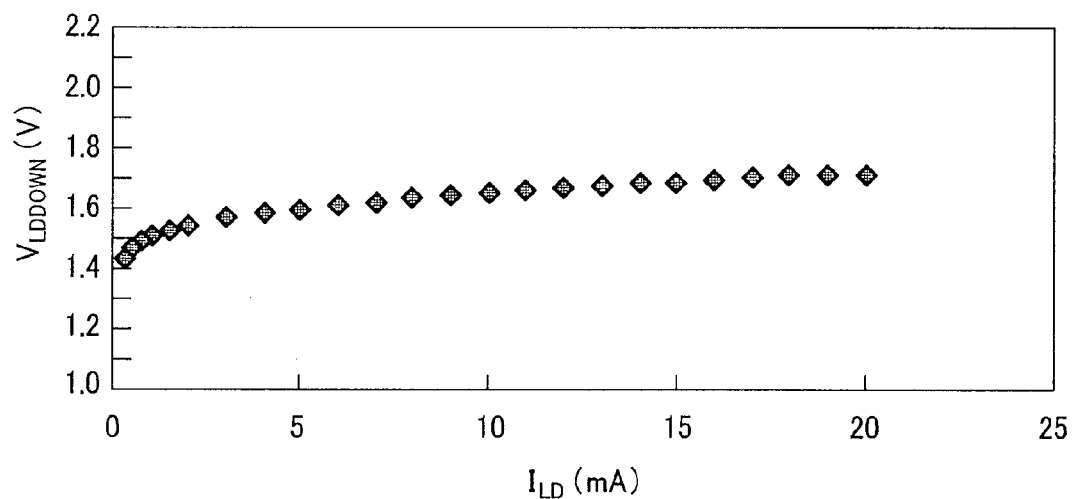
FIG. 13 is a graph explaining a relationship between a supplying current and a drop voltage in a semiconductor laser.
Figure 14:
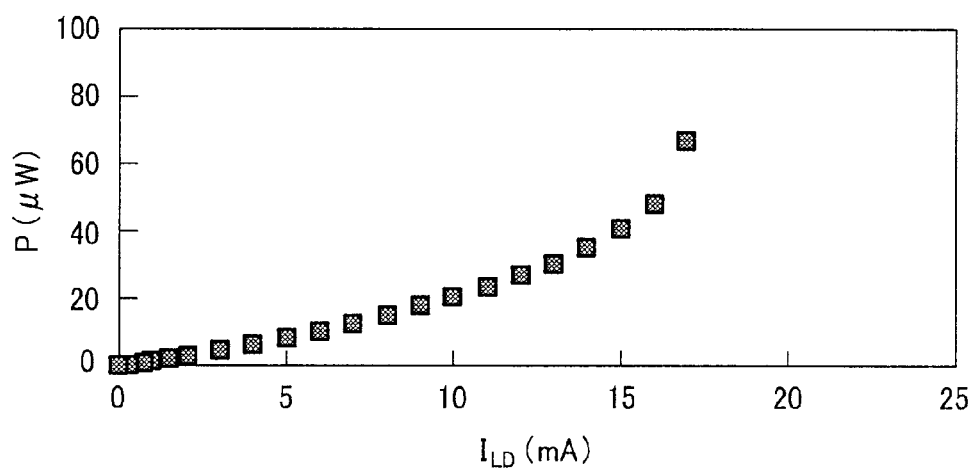
FIG. 14 is a graph explaining a relationship between the supplying current and a light output in the semiconductor laser.
Figures 15, 16:
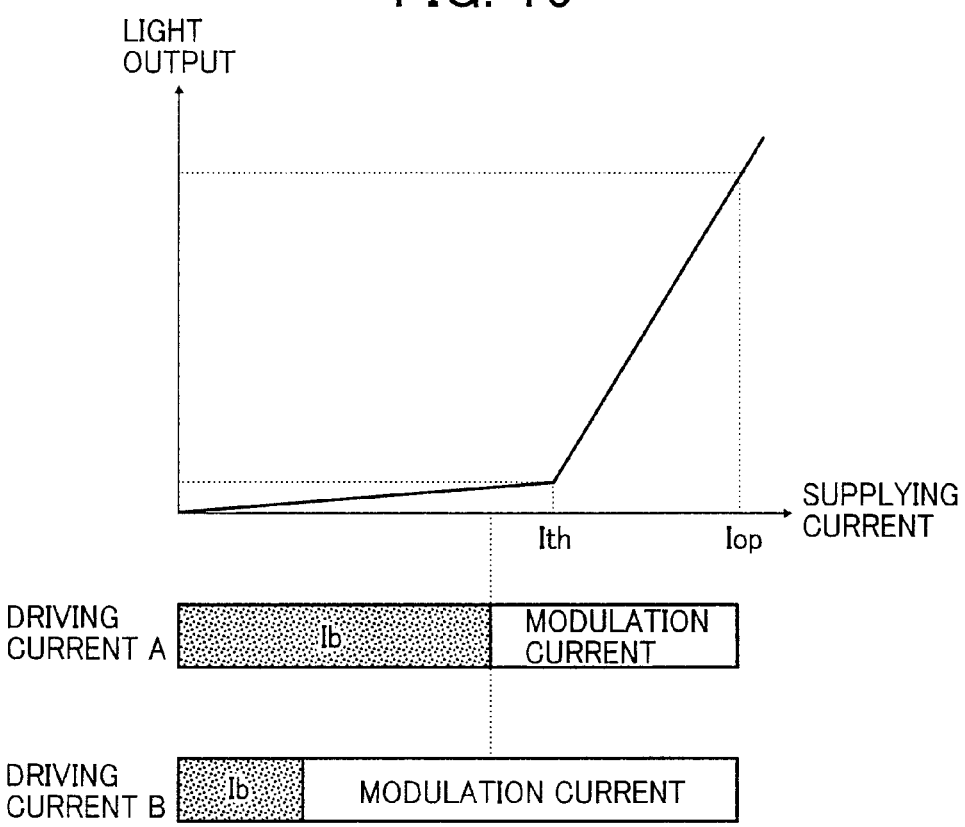
FIG. 15 is a table explaining specific numeral values of FIGS. 13 and 14.
FIG. 16 is a schematic diagram explaining allocation examples of a bias current and a modulation current in an operating current.

FIG. 13 illustrates a measurement result of an LD drop voltage $V_{LDDOWN}$ (V) when a minute current $I_{LD}$ is supplied to a generally commercially available semiconductor laser (LD). FIG. 14 illustrates a measurement result of a light output P (μW) when the minute current $I_{LD}$ is supplied to the semiconductor laser (LD). FIG. 15 lists specific numerical values of FIGS. 13 and 14.

As can be seen from FIGS. 13 and 15, the LD drop voltage $V_{LDDOWN}$ gradually increases as the LD current $I_{LD}$ increases. When the LD current $I_{LD}$ is 0.25 mA, the LD drop voltage $V_{LDDOWN}$ is about 1.4 V.

Because the semiconductor laser (LD) has a direct-current resistance component, the LD drop voltage $V_{LDDOWN}$ gradually increases as the LD current $I_{LD}$ increases. However, the LD drop voltage $V_{LDDOWN}$ increases up to about 1.4 V when the LD current $I_{LD}$ is 0.25 mA as described above, though the LD drop voltage $V_{LDDOWN}$ is zero when the LD current $I_{LD}$ is zero. It is conceivable that impedance of the semiconductor laser (LD) becomes sufficiently small just by supplying a minute current of 0.25 mA, and response characteristics in a subsequent supplying of a threshold current is sufficiently improved.

Consequently, it can be seen that supplying the semiconductor laser (LD) with a minute bias current of about 1 mA in advance enables the semiconductor laser (LD) to respond at a high speed and a small drop voltage change.

As can be seen from FIGS. 14 and 15, even when the LD current $I_{LD}$ is 1 mA, the light-emitting output of the semiconductor laser (LD) is 1.26 μW. This current value is not high enough to adversely affect an image forming apparatus because 1 mA is about 0.1% of the light-emitting output, typically 1 mW or more, of the semiconductor laser (LD).

In addition, when a semiconductor laser array (LD array) is auto power controlled using single light amount monitor PD, it is not problematic that other light-emitting elements emit minute light of about 1 μW while a light amount of one light-emitting element is controlled.

Other semiconductor lasers (LDs) exhibit the same characteristics as those of FIGS. 13 to 15.

The shorter oscillation wavelength the semiconductor laser (LD) has, the longer the response time becomes when a current is supplied. In addition, the shorter oscillation wavelength the semiconductor laser (LD) has, the larger the direct-current resistance component becomes.

Various types can be considered for allocating a bias current Ib and a modulation current in an operating current that is a driving current for the semiconductor laser to emit light (refer to FIG. 16). In FIG. 16, Iop represents the operating current.

(1) Driving Current A

A driving current A is a driving current in which a bias current is slightly smaller than an oscillation threshold current Ith. In this case, when a light-emitting signal is in a low level, the semiconductor laser is in an "LED light-emitting state" in which the semiconductor laser does not carry out LD light emission. Once a modulation current is applied after the light-emitting signal becomes a high level, the semiconductor laser becomes an "LD light-emitting state" to start to emit light.

Figure 17:
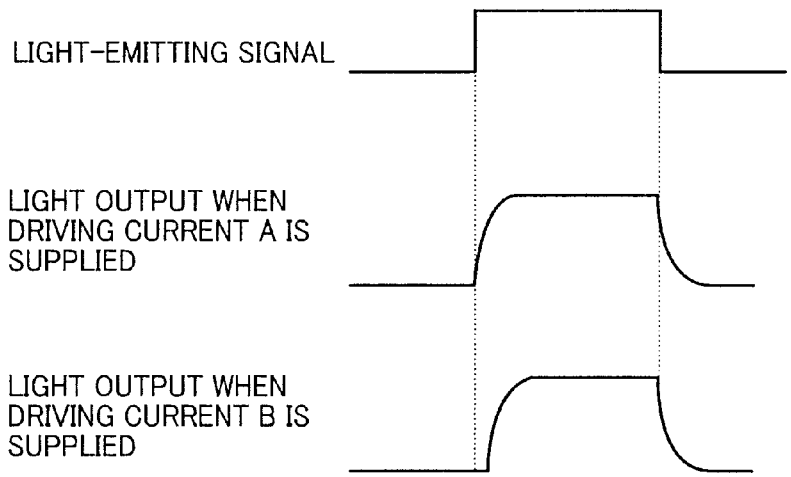
FIG. 17 is a schematic diagram explaining light waveforms corresponding to a driving current A and a driving current B of FIG. 16.
Figure 18:
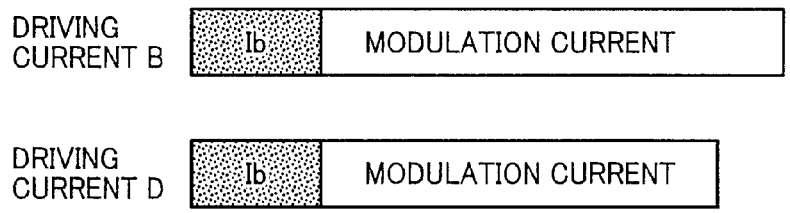
FIG. 18 is a schematic diagram exemplarily explaining two driving currents having different operating currents.
Figure 19:
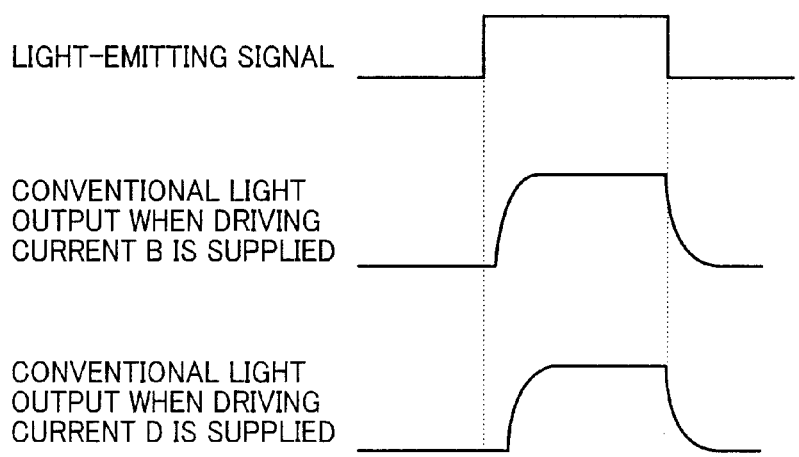
FIG. 19 is a schematic diagram explaining conventional light waveforms corresponding to the driving current B and a driving current D of FIG. 18.

In this case, the pulse width reduction hardly occurs (refer to FIG. 17).

However, an offset light-emitting amount becomes large because the bias current is close to the oscillation threshold current Ith. As a result, a background fog may occur in an image forming apparatus. In addition, a large offset light-emitting amount causes electric charges in a photosensitive element to be charged by light. As a result, image quality may be adversely affected.

(2) Driving Current B

A driving current B is a driving current in which the bias current Ib is reduced compared with that of the driving current A and a modulation current is increased by that amount. In this case, the driving current B is not so much effective for preventing the occurrence of the pulse width reduction (refer to FIG. 17).

In the semiconductor laser, light-emitting delay characteristics vary depending on an amount of an injection current. Generally, the smaller the driving current is, the longer the light-emitting delay becomes, i.e., the pulse width reduction occurs (refer to FIGS. 18 and 19).

Next, how to determine an expansion amount by the expansion circuit 221*d* is described.

Figure 20:
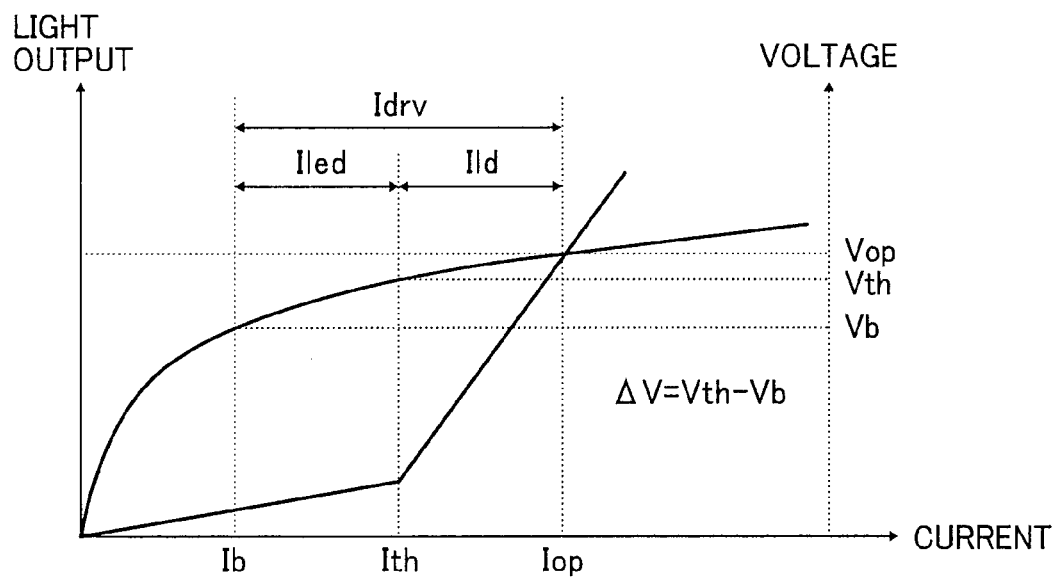
FIG. 20 is a schematic diagram explaining a current Ild corresponding to an LD light-emitting region, a current Iled corresponding to an LED light-emitting region, and a difference voltage $\Delta V$.

Here, as exemplary illustrated in an IL characteristic in FIG. 20, (Iop−Ith) is defined as a current Ild corresponding to an LD light-emitting region and (Ith−Ib) is defined as a current Iled corresponding to an LED light-emitting region. In addition, (Ild+Iled) is defined as a laser driving current Idrv driving the laser at high speed.

Furthermore, let Vop be the operating voltage when the semiconductor laser is emitting light, Vth be the voltage when a threshold current is supplied, and Vb be the voltage when a bias current is supplied. In addition, (Vth−Vb) is defined as a difference voltage ΔV.

Figure 21:
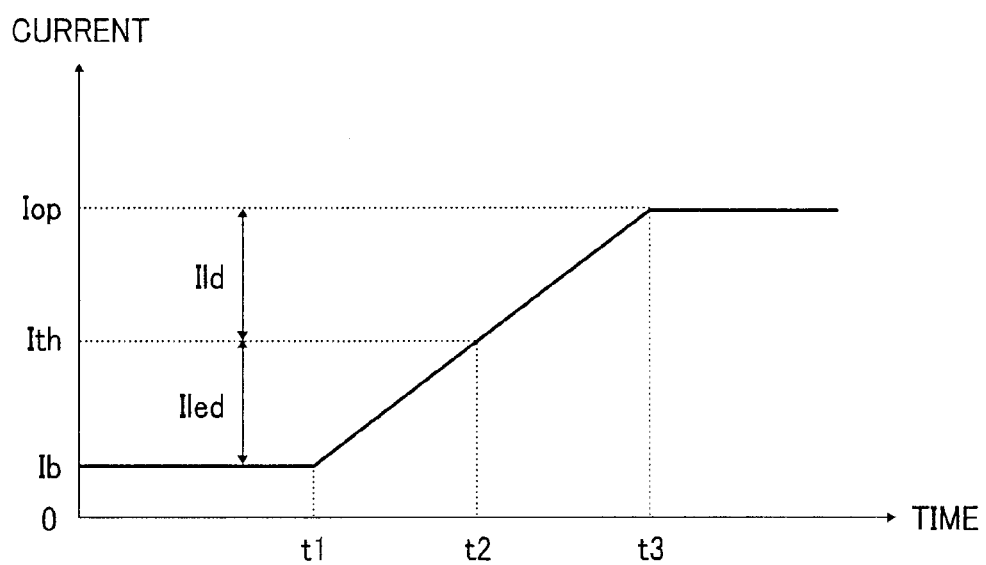
FIG. 21 is a schematic diagram explaining a temporal change of a driving current supplied to a semiconductor laser.

FIG. 21 illustrates a current waveform when the semiconductor laser emits light. In FIG. 21, the current starts to rise at time t1, reaches (Ib+Iled) at time t2, and becomes Iop (=Ib+Iled+Ild) at time t3. In FIG. 21, it is assumed that the current linearly rises for easy understanding.

Figure 22:
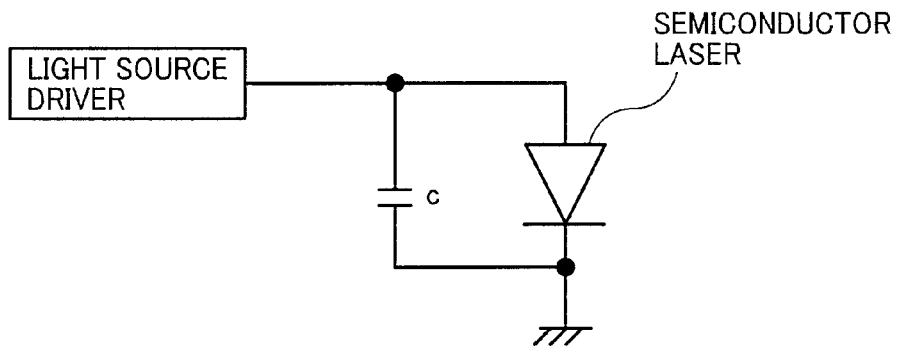
FIG. 22 is a schematic diagram explaining stray capacitance.

There is stray capacitance, such as the output capacitance of a light source driver, the wire capacitance of a circuit board, and the input capacitance of a packaging member holding the semiconductor laser, between the light source driver and the semiconductor laser. FIG. 22 illustrates an equivalent circuit in which the total of these capacitances is indicated by "C".

A modulation current from the light source driver charges the stray capacitance C and thereafter is supplied to the semiconductor laser.

Figure 23:
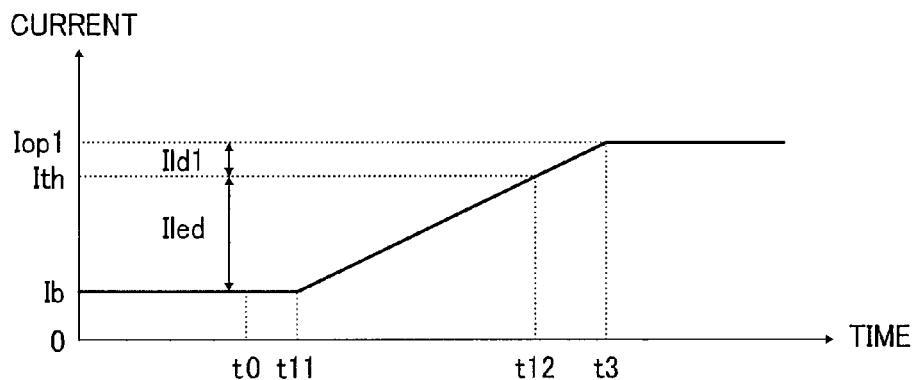
FIG. 23 is a schematic diagram explaining a temporal change of a driving current supplied to the semiconductor laser when the operating current is Iop1.
Figure 24:
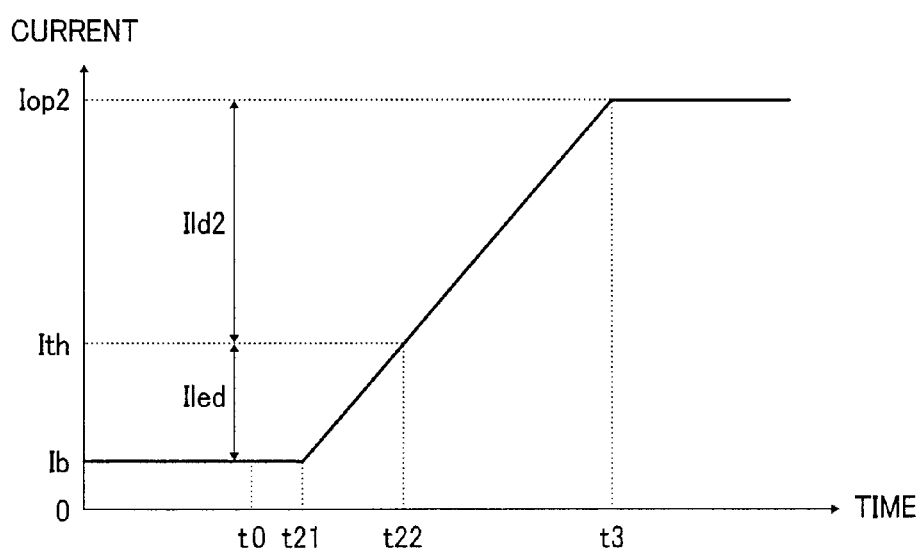
FIG. 24 is a schematic diagram explaining a temporal change of a driving current supplied to the semiconductor laser when the operating current is Iop2 (>Iop1)

In this case, FIG. 23 illustrates a current waveform when the operating current is Iop1 while FIG. 24 illustrates a current waveform when the operating current is Iop2 (>Iop1). A driving current supplying start time is set as t0. In addition, it is assumed that (t3−t0) is constant regardless of an amount of the operating current.

When the operating current is Iop1, a current supplied to the semiconductor laser is Ib at time t0, still Ib at time t11, (Ib+Iled) at time t12, and Iop1 (Ib+Iled+Ild1) at time t3. A current flows in the stray capacitance during the time period from t0 to t11.

When the operating current is Iop2, a current supplied to the semiconductor laser is Ib at time t0, still Ib at time t21, Ith (Ib+Iled) at time t22, and Iop2 (Ib+Iled+Ild2) at time t3. A current flows in the stray capacitance C during the time period from t0 to t21.

It is conceivable that a "pulse width reduction" in a light waveform relates to the sum of (1) charge time for the stray capacitance C and (2) a time period taken from rising of a current value to reach Ith (hereinafter, also referred to as "Ith reaching time").

(1) Charge Time for the Stray Capacitance C

When the operating current is Iop1, the sum of the charge time and the Ith reaching time is (t12−t0) because the charge time is (t11−t0) and the Ith reaching time is (t12−t11).

When the operating current is Iop2, the sum of the charge time and the Ith reaching time is (t22−t0) because the charge time is (t21−t0) and the Ith reaching time is (t22−t21).

An electric charge Q charged in the stray capacitance C is represented as Q=C×ΔV. Accordingly, the electric charge Q is represented by formula (1) when the operating current is Iop1 while represented by formula (2) when the operating current is Iop2.

$$Q = \tfrac{1}{2} \times Iop1 \times \{(t11-t0)/(t3-t0)\} \times (t11-t0) \quad (1)$$

$$Q = \tfrac{1}{2} \times Iop2 \times \{(t12-t0)/(t3-t0)\} \times (t12-t0) \quad (2)$$

A relationship represented by formula (3) can be obtained from formulas (1) and (2) by letting Iop1/Iop2=K.

$$(t12-t0)/(t11-t0) = K^{1/2} \quad (3)$$

Consequently, the charge time ratio can be found if K is known.

For example, if an expansion amount Ec1 is known that is of a pulse width of a light-emitting signal attributed to stray capacitance when the operating current is Iop1, when the operating current is Iop2, an expansion amount Ec2 of a pulse width of a light-emitting signal attributed to stray capacitance at this time can be obtained by formula (4).

$$Ec2 = Ec1 \times (Iop1/Iop2)^{1/2} \quad (4)$$

When Iled is sufficiently small, ΔV is also sufficiently small. In this case, it is not necessary to correct a pulse width reduction caused by stray capacitance. Specifically, no correction is needed when Iled/(Iled+Ild)<0.1, i.e., the stray capacitance C has been already sufficiently charged, while correction is needed when Iled/(Iled+Ild)≥0.1 because charging of the stray capacitance C is not negligible.

(2) Ith Reaching Time

The ratio (t12−t11)/(t22−t21) of the Ith reaching time when the operating current is Iop1 to the Ith reaching time when the operating current is Iop2 equals to the operating current ratio Iop1/Iop2 and therefore becomes K.

For example, if an expansion amount $E_{LED}1$ is known that is of a pulse width of a light-emitting signal attributed to the Ith reaching time when the operating current is Iop1, when the operating current is Iop2, an expansion amount $E_{LED}2$ of a pulse width of a light-emitting signal attributed to the Ith reaching time at this time can be obtained by formula (5).

$$E_{LED}2 = E_{LED}1 \times (Iop1/Iop2) \quad (5)$$

Consequently, when the operating current is Iop2, a pulse width reduction can be reduced by setting the expansion amount of a pulse width of a light-emitting signal to Ec2+$E_{LED}2$.

The description is made specifically below.

Figure 25:
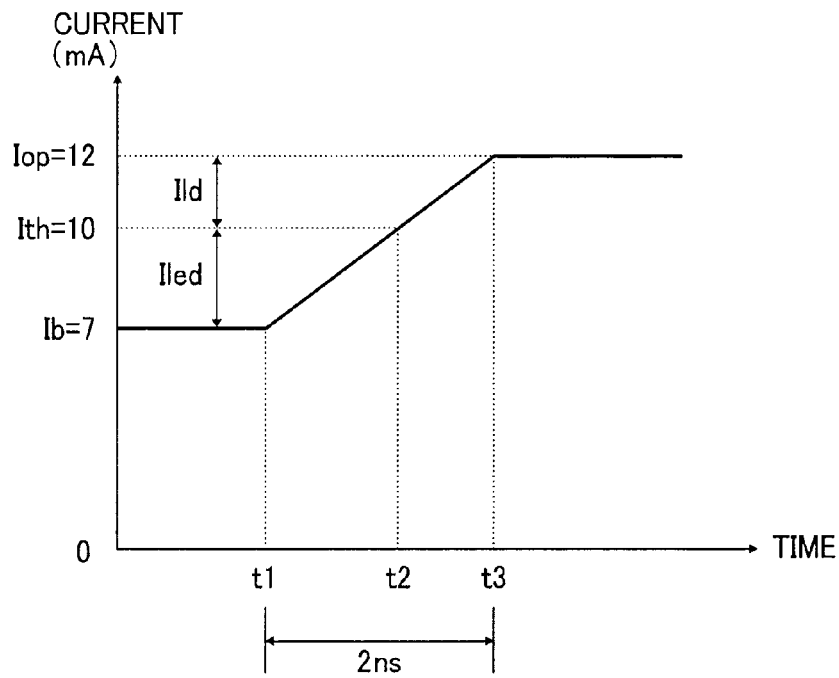
FIG. 25 is a schematic diagram explaining a temporal change of a driving current supplied to an edge emitting laser.

A. A case is explained where the semiconductor laser is an edge emitting laser and a current waveform is given as illustrated in FIG. 25.

The rising time of a driving current supplied to the semiconductor laser is 2 [ns], Ib=7 [mA], Ith=10 [mA], Iop=12 [mA], and Vop−Vb(=ΔV)=0.25 [V]. In other words, Iled=3 [mA] and Iled=2 [mA].

The description is made below when a current It that is the sum of Iled and Ild, i.e., 5 [mA], is supplied to the semiconductor laser.

A-1. Charge Time for the Stray Capacitance C

When the stray capacitance C is 5 pF, formula (6) is obtained based on the relationship of Q=C×ΔV.

$$Q = 5 \times 10^{-12} \times 0.25 = 1.25 \times 10^{-12} \quad (6)$$

A current Itr that is supplied at the rising portion is represented by formula (7) as a function of time t [s].

$$Itr = 2.5 \times 10^{-3} \times 10^9 \times t \quad (7)$$

Q is also represented by formula (8).

$$Q = \tfrac{1}{2} \times Itr \times t \quad (8)$$

By substituting formula (7) into formula (8), formula (9) is obtained.

$$Q = \tfrac{1}{2} \times 2.5 \times 10^{-3} \times 10^9 \times t^2 \quad (9)$$

Because formula (6) equals to formula (9), $t=1\times10^{-9}$ [s]. In other words, a rising delay of 1 [ns] occurs because of charging of the stray capacitance C.

In the case where Ild=20 [mA] and the current It, i.e., (Iled+Ild)=23 mA, is supplied, when the calculation is carried out in the same manner as described above, the result shows that $t=0.466\times10^{-9}$ [s]. In other words, a rising delay of 0.466 [ns] occurs.

Here, let ta be the rising delay when the summed current value of Iled and Ild is Ita, and tb be the rising delay when the summed current value of Iled and Ild is Itb, the relationship represented by formula (10) is obtained.

$$ta/tb = (Ita/Itb)^{1/2} \quad (10)$$

A-2. Ith Reaching Time

The Ith reaching time t2 can be obtained by formula (11). Here, (t3−t1) is 2 [ns].

$$t2 = (t3-t1) \times Iled/(Iled+Ild) \quad (11)$$

Accordingly, when Iled=3 [mA] and Ild=2 [mA], the Ith reaching time t2 is 1.2 [ns]: 2 [ns]×(3 [mA]/5 [mA])=1.2 [ns]. In other words, a delay of 1.2 [ns] occurs.

When Iled=3 [mA] and Ild=20 [mA], the Ith reaching time t2 is 0.26 [ns]: 2 [ns]×(3 [mA]/23 [mA])=0.26 [ns]. In other words, a delay of 0.26 [ns] occurs.

Here, let t2a be the Ith reaching time when the summed current value of Iled and Ild is Ita, and t2b be the Ith reaching time when the summed current value of Iled and Ild is Itb, the relationship represented by formula (12) is obtained.

$$t2a/t2b = 2(Ita/Itb) \quad (12)$$

A-3. Pulse Width Reduction Amount

The pulse width reduction amount is the sum of the charge time for the stray capacitance C and the Ith reaching time. Therefore, when It=5 [mA], the pulse width reduction amount is 2.2 [ns], and when It=23 mA, the pulse width reduction amount is 0.726 [ns].

Figure 26:
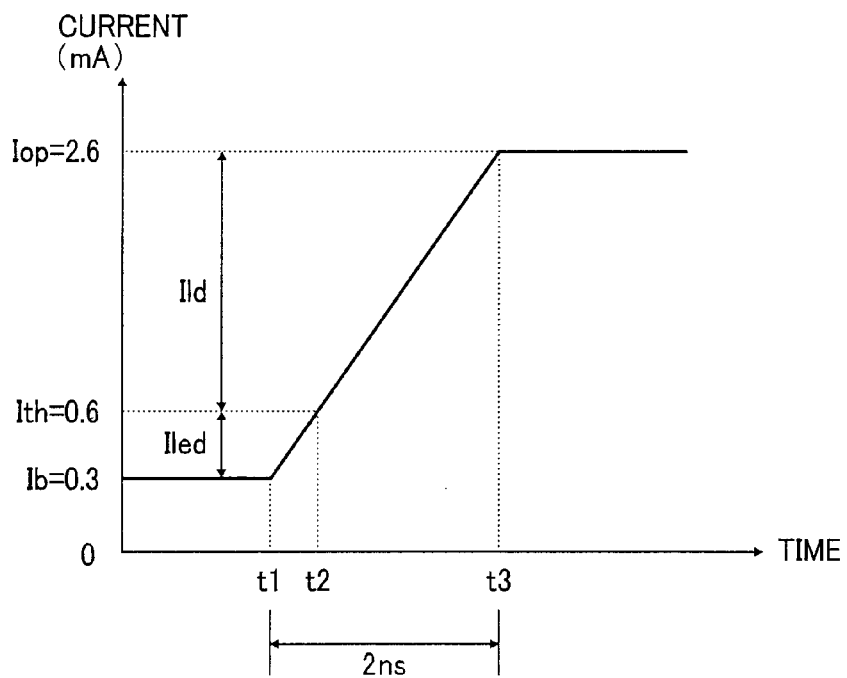
FIG. 26 is a schematic diagram explaining a temporal change of a driving current supplied to a vertical cavity surface emitting laser.

B. A case is explained where the semiconductor laser is a vertical cavity surface emitting laser (VCSEL) and a current waveform is given as illustrated in FIG. 26.

The rising time of a driving current supplied to the semiconductor laser is 2 [ns], Ib=0.3 [mA], Ith=0.6 [mA], Iop=2.6 [mA], and Vop−Vb (=ΔV)=0.34 [V]. In other words, Iled=0.3 [mA] and Iled=0.2 [mA].

The description is made below when the current It that is the sum of Iled and Ild, i.e., 0.5 [mA], is supplied to the semiconductor laser.

B-1. Charge Time for the Stray Capacitance C

When the stray capacitance C is 5 pF, formula (13) is obtained based on the relationship of Q=C×ΔV.

$$Q = 5 \times 10^{-12} \times 0.34 = 1.7 \times 10^{-12} \quad (13)$$

Because formula (13) equals to formula (9), $t=3.69\times10^{-9}$ [s]. In other words, a rising delay of 3.69 [ns] occurs.

In the case where Ild=2 [mA] and the current It, i.e., (Iled+Ild)=2.3 mA, is supplied, when the calculation is carried out in the same manner as described above, the result shows that $t=0.466\times10^{-9}$ [s]. In other words, a rising delay of 0.466 [ns] occurs.

Here, let ta be the rising delay when the summed current value of Iled and Ild is Ita, and tb be the rising delay when the summed current value of Iled and Ild is Itb, the same relationship represented by the above-described formula (10) is obtained.

B-2. Ith Reaching Time

The Ith reaching time t2 can be obtained by the above-described formula (11). Here, (t3−t1) is 2 [ns].

Accordingly, when Iled=0.3 [mA] and Ild=0.2 [mA], the Ith reaching time t2 is 1.2 [ns]: 2 [ns]×(0.3 [mA]/0.5 [mA])=1.2 [ns]. In other words, a delay of 1.2 [ns] occurs.

When Iled=0.3 [mA] and Ild=2 [mA], the Ith reaching time t2 is 0.26 [ns]: 2 [ns]×(0.3 [mA]/2.3 [mA])=0.26 [ns]. In other words, a delay of 0.26 [ns] occurs.

Here, let t2a be the Ith reaching time when the summed current value of Iled and Ild is Ita, and t2b be the Ith reaching time when the summed current value of Iled and Ild is Itb, the same relationship represented by the above-described formula (12) is obtained.

B-3. Pulse Width Reduction Amount

The pulse width reduction amount is the sum of the charge time for the stray capacitance C and the Ith reaching time. Therefore, when It=0.5 [mA], the pulse width reduction amount is 4.88 [ns], and when It=2.3 [mA], the pulse width reduction amount is 0.726 [ns].

The vertical cavity surface emitting laser needs to correct the pulse width reduction with a larger amount than the case where the edge emitting laser is used because the vertical cavity surface emitting laser causes a larger signal delay amount due to a smaller driving current than that of the edge emitting laser. When the edge emitting laser is used in cases where Ith, a driving current, and a light amount are small, it is effective to correct a light-emitting signal in the same manner as of the vertical cavity surface emitting laser.

C. Expansion Amount

An expansion amount is obtained by using either formula (14) or (15). Either formula may be used depending on a system from a point of view of suitability for the system.

$$(\text{charge time for the stray capacitance } C)+(I\text{th reaching time}) \quad (14)$$

$$\{(\text{charge time for the stray capacitance } C)^2+(I\text{th reaching time})^2\}^{1/2} \quad (15)$$

For example, when the charge time for the stray capacitance C is 3 [ns] and the Ith reaching time is 2 [ns], the expansion amount is obtained as 5 [ns] by using the formula (14) while obtained as 3.6 [ns] by using the formula (15).

As described above, the charge time ratio for the stray capacitance C and the Ith reaching time ratio in relation to two different operating currents relate to the ratio of the two operating currents. Accordingly, when an initial evaluation is carried out and the result is stored in a memory (not shown), a proper expansion amount can be determined by using the above ratio even if the operating current is changed.

In other words, a system that sets an expansion amount according to a ratio of modulation currents can determine a proper expansion amount. As a result, a light output having a stable pulse width can be maintained. This system can be realized by obtaining a relationship between a plurality of light-emitting signals having different delay amounts and practical pulse width reduction amounts in an initial evaluation. In addition, there is an advantage that the initial evaluation needs to be carried out only one time.

D. Algorithm for Expansion Correction

D-1. When a device is being adjusted or set up, at a certain bias current or a certain light amount, the current It (analog value) that is the sum of Iled and Ild, a rising delay caused by charging of the stray capacitance C, and the Ith reaching time are measured, and stored in a memory as references. Let Is be the current It, T1 be the rising delay caused by charging of the stray capacitance C, and T2 be the Ith reaching time.

D-2. The current It (analog value) that is the sum of Iled and Ild is measured when the device is being operated, and a rising delay amount tc caused by charging of the stray capacitance C is calculated by formula (16).

$$tc=(It/Is)^{1/2} \cdot T1 \quad (16)$$

An Ith reaching time tth is calculated by formula (17).

$$tth=(It/Is) \cdot T2 \quad (17)$$

D-3. An expansion amount Ep is calculated by formula (18) or (19).

$$Ep=tc+tth \quad (18)$$

$$Ep=(tc^2+tth^2)^{1/2} \quad (19)$$

When the bias current is set to be variable, references are measured in the same manner as in the above step D-1 when the bias current is variably adjusted (e.g., at APC or at Ith detection), and the references are stored in a memory. Generally, the bias current is changed mostly between pages (because there is sufficient time).

E. Initialization of Modulation Current

A modulation current is initialized by the differential quantum efficiency detection circuit 221b at power activation or resetting.

Figure 27:
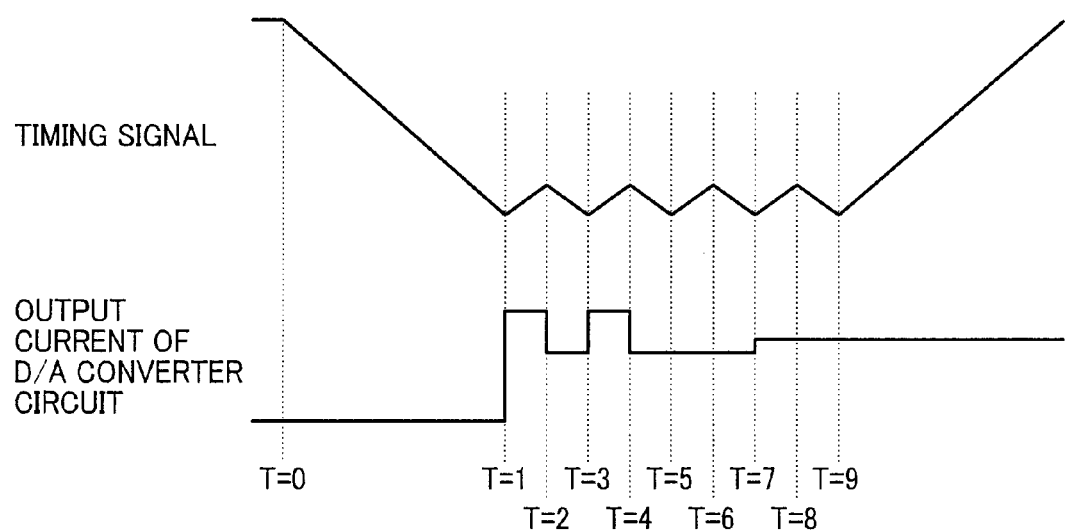
FIG. 27 is a schematic diagram of setting processing of a modulation current carried out in initialization processing.

The timing signal generation circuit 221a produces, as exemplarily illustrated in FIG. 27, 10 types of timing, i.e., T=0 to T=9. The semiconductor laser is forced to emit light (current value=Iop) at T=0, is in offset light emission (current value=around Ith) at T=1, and stops emitting light (current value=Ib) at T=9.

A modulation current is set in such a manner that the sample hold circuit 221f holds (Iop–Ith) at T=1, a current value of an output current (hereinafter, also referred to as a "D/A current") of the D/A converter circuit 221c is sequentially compared with the hold value from T=1 to T=9 from a larger value so that a setting value of the D/A current equals to the hold value. The necessary number of types of timing differs depending on a bit configuration of the D/A converter circuit 221c while the D/A converter circuit 221c described above has the 8-bit configuration.

As apparent from the forgoing description, the light source control device 22 structures a laser driving device of the present invention in the optical scanning device 1010 according to the embodiment. In addition, the writing control circuit 219 and the expansion circuit 221d structure an expansion circuit of the laser driving circuit of the present invention.

Furthermore, the light source control device 22 carries out a laser driving method of the present invention.

As described above, the light source device 10 according to the embodiment includes the light source 11, the coupling lens 13, the first aperture plate 14, the monitor optical system, the photoreceptor 18, and the light source control device 22.

The light source control device 22 includes, for example, the pixel clock generation circuit 215, the image processing circuit 216, the writing control circuit 219, and the light source driving circuit 221.

The writing control circuit 219 produces a selection signal for expanding a pulse width of a light-emitting signal based on a difference between the pulse width of the light-emitting signal and a lighting pulse width of the laser chip 100.

The light source driving circuit 221 includes the expansion circuit 221d that expands a pulse width based on the selection signal from the writing control circuit 219, and a driver that outputs a driving signal corresponding to a light-emitting signal of which the pulse width has been expanded.

In this case, the light source device 10 can carry out high accuracy pulse light emission because a pulse width reduction of a light waveform of light emitted from the laser chip 100 is reduced without shortening the life of the laser chip 100. In addition, linearity of an integral light amount of a light output with respect to a light-emitting signal can be enhanced.

When the light-emitting properties of the laser chip is changed due to replacement of the laser chip, for example, the light source device 10 can easily address the change because the expansion circuit 221d can change an expansion amount by a selection signal. Accordingly, the versatility of the light source device 10 is enhanced and the light source device 10 can be provided at a low cost.

The optical scanning device 1010 according to the embodiment can carry out high accuracy optical scanning because the light source device 10 is included therein.

Multiple scanning can be performed simultaneously because the laser chip 100 includes a plurality of light-emitting elements. As a result, high speed image forming can be achieved.

Furthermore, the laser printer 1000 according to the embodiment can form high quality images having excellent tone reproduction in a low density because the optical scanning device 1010 is included therein.

Generally, in semiconductor lasers, the shorter the oscillation wavelength is, the longer the response time becomes and also the larger the direct-current resistance component becomes. When a semiconductor laser having a shorter oscillation wavelength is used (from the 780-nm range to the 650-nm range or the 500-nm range), the light source device of the present embodiment can prevent the occurrence of the pulse width reduction even if a minute bias current is applied and a time period taken for flowing a threshold current is shortened. Consequently, the image forming apparatus can further reduce the background fog than ever.

In the above embodiment, the oscillation wavelength of the light-emitting element is the 780-nm range. However, the wavelength is not limited to the 780-nm range. The oscillation wavelength of the light-emitting element may be changed according to the characteristics of a photosensitive element.

In the above embodiment, the laser chip includes 32 light-emitting elements. However, the laser chip is not limited to this number.

The light source device 10 may be used for other applications in addition to the image forming apparatus. The oscillation wavelength of the laser chip 100 may be set to the specific wavelength range, such as the 650-nm range, the 850-nm range, the 980-nm range, the 1.3-μm range, and the 1.5-μm range, according to the application.

In the above embodiment, the optical scanning device 1010 is used for a printer. However, the optical scanning device 1010 can be used for other image forming apparatuses, such as copying machines, facsimiles, and multifunction peripherals in which the copying machines and facsimiles are gathered, in addition to printers.

In the above embodiment, the laser printer 1000 is described as the image forming apparatus. However, the image forming apparatus is not limited to a laser printer. In short, any image forming apparatus including the optical scanning device 1010 may be available.

For example, the image forming apparatus may be an image forming apparatus directly radiating laser light onto a medium (such as paper) coloring by the laser light.

The image forming apparatus may be an image forming apparatus in which a silver-salt film is used as an image carrier. In this case, a latent image is formed on the silver-salt film by optical scanning, and the latent image can be visualized by a process same as a development process in a common silver halide photography process. The image can be transferred onto photographic paper by a process same as a printing process in a common silver halide photography process. Such image forming apparatuses can serve as an optical plate-making device or an optical drawing device for drawing CT scan images or the like.

Figure 28:
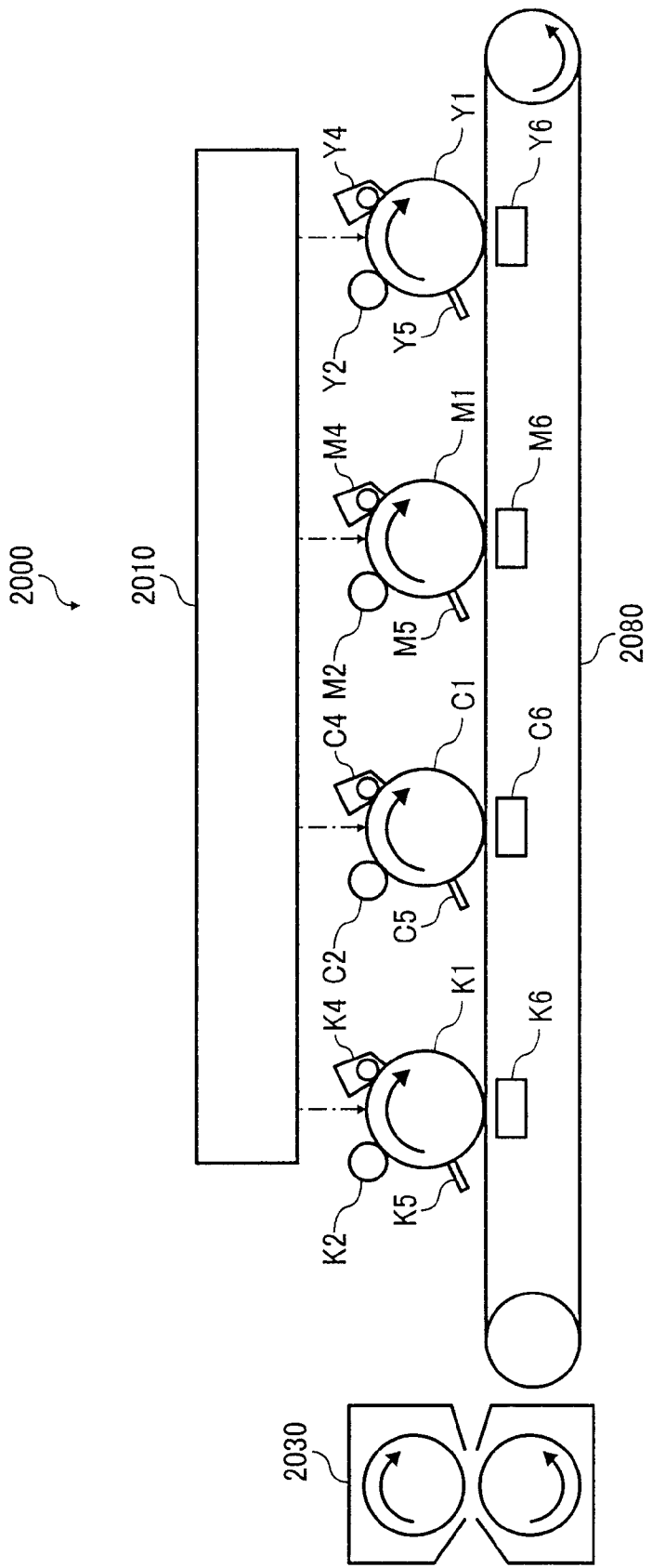
FIG. 28 is a schematic diagram explaining a schematic configuration of a color printer.

For example, as illustrated in FIG. 28, the image forming apparatus may be a color printer 2000 including a plurality of photosensitive drums.

The color printer 2000 is a tandem multiple color printer that forms images in full color by superimposing four colors (black, cyan, magenta, and yellow). The color printer 2000 includes: for example, "a photosensitive drum K1, a charging unit K2, a developing unit K4, a cleaning unit K5, and a transfer unit K6" for black; "a photosensitive drum C1, a charging unit C2, a developing unit C4, a cleaning unit C5, and a transfer unit C6" for cyan; "a photosensitive drum M1, a charging unit M2, a developing unit M4, a cleaning unit M5, and a transfer unit M6" for magenta; "a photosensitive drum Y1, a charging unit Y2, a developing unit Y4, a cleaning unit Y5, and a transfer unit Y6" for yellow; an optical scanning device 2010, a transfer belt 2080, and a fixing unit 2030.

The photosensitive drums rotate in the corresponding arrow directions in FIG. 28. The charging unit, the developing unit, the transfer unit, and the cleaning unit are arranged around each photosensitive drum in its rotation direction.

Each of the charging units uniformly charges the surface of the corresponding photosensitive drum. The optical scanning device 2010 optically scans the surface of each photosensitive drum charged by the charging unit to form a latent image on the photosensitive drum.

The corresponding developing unit forms a toner image on the surface of the photosensitive drum. Subsequently, the corresponding transfer unit sequentially transfers the toner image in each color onto a recording sheet on the transfer belt 2080, and finally, the fixing unit 2030 fixes the image on the recording sheet.

The optical scanning device 2010 includes a light source device similar to the light source device 10 for each color. Accordingly, the optical scanning device 2010 can obtain effects similar to those obtained in the optical scanning device 1010.

As a result, the color printer 2000 can obtain effects similar to those obtained in the laser printer 1000.

Although the tandem multiple color printer may cause color deviation in each color due to factors related to machine accuracy or the like, accuracy in correcting color deviation in each color can be enhanced by selecting the light-emitting element to be lighted.

The color printer 2000 may include an optical scanning device per color or per two colors.

Accordingly, a pulse light emission by the semiconductor laser can be carried out with high accuracy without shortening the life of the laser.

Moreover, high accuracy light scanning can be carried out because a pulse light emission by the semiconductor laser can be carried out with high accuracy.

Furthermore, high quality images can be formed because the device includes the optical scanning device of the present invention.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser driving device that drives a semiconductor laser based on an expanded light-emitting signal that is based on a light-emitting signal, the laser driving device comprising:
   an expansion circuit that generates the expanded light-emitting signal by expanding a pulse width of the light-emitting signal based on a known difference between the pulse width of the light-emitting signal and a lighting pulse width of the semiconductor laser when the semiconductor laser emits light according to the light-emitting signal; and
   a driver that outputs a driving signal to the semiconductor laser according to an output signal of the expansion circuit.

2. The laser driving device according to claim 1, wherein the expansion circuit expands the pulse width of the light-emitting signal according to a time period taken for the semiconductor laser to shift from an LED light-emitting state to an LD light-emitting state when an operating current is supplied to the semiconductor laser.

3. The laser driving device according to claim 2, wherein the operating current is a sum of a bias current and a modulation current, and
   the expansion circuit expands the pulse width of the light-emitting signal based on a ratio of (Ith−Ib) to (Iop−Ith) where Ith is a threshold current, Ib is the bias current, and Iop is the operating current of the semiconductor laser.

4. The laser driving device according to claim 2, wherein an expansion amount $E_{LED}1$ of the pulse width of the light-emitting signal when an operating current Iop1 is supplied to the semiconductor laser is known, and
   the expansion circuit determines an expansion amount $E_{LED}2$ of the pulse width of the light-emitting signal when an operating current Iop2 is supplied to the semiconductor laser, by a formula:

$$E_{LED}2 = E_{LED}1 \times (Iop1/Iop2).$$

5. The laser driving device according to claim 1, wherein the expansion circuit expands the pulse width of the light-emitting signal according to stray capacitance between the driver and the semiconductor laser.

6. The laser driving device according to claim 5, wherein an expansion amount Ec1 of the pulse width of the light-emitting signal when an operating current Iop1 is supplied to the semiconductor laser is known, and the expansion circuit determines an expansion amount Ec2 of the pulse width of the light-emitting signal when an operating current Iop2 is supplied to the semiconductor laser, by a formula:

$$Ec2=Ec1\times(Iop1/Iop2)^{1/2}.$$

7. The laser driving device according to claim 4, wherein the expansion circuit further expands the pulse width of the light-emitting signal according to stray capacitance between the driver and the semiconductor laser.

8. The laser driving device according to claim 7, wherein
an expansion amount Ec1 of the pulse width of the light-emitting signal attributed to the stray capacitance, when the operating current Iop1 is supplied to the semiconductor laser is known, and
the expansion circuit determines an expansion amount Ec2 of the pulse width of the light-emitting signal attributed to the stray capacitance, when the operating current Iop2 is supplied to the semiconductor laser, by a formula:

$$Ec2=Ec1\times(Iop1/Iop2)^{1/2}.$$

9. The laser driving device according to claim 1, wherein the expansion circuit includes a selection circuit that selects one expansion amount from a plurality of already set expansion amounts.

10. The laser driving device according to claim 1, further comprising:
a photoreceptor that detects a light-emitting amount of the semiconductor laser; and
a control device that controls the light-emitting amount of the semiconductor laser based on an output signal of the photoreceptor.

11. An optical scanning device that scans a scan target surface with light, the optical scanning device comprising:
a semiconductor laser;
the laser driving device according to claim 1 that drives the semiconductor laser;
a deflector that deflects light from the semiconductor laser; and
a scanning optical system that collects light deflected by the deflector on the scan target surface.

12. The optical scanning device according to claim 11, wherein the semiconductor laser is a vertical cavity surface emitting laser.

13. An image forming apparatus comprising:
at least one image carrier; and
at least one optical scanning device according to claim 11 that scans the at least one image carrier with light modulated according to image information.

14. The image forming apparatus according to claim 13, wherein the image information is multiple color image information.

15. A laser driving method for driving a semiconductor laser based on an expanded light-emitting signal that is based on a light-emitting signal, the laser driving method comprising:
determining a difference between a pulse width of the light-emitting signal and a lighting pulse width of the semiconductor laser when the semiconductor laser emits light according to the light-emitting signal;
generating the expanded light-emitting signal by expanding the pulse width of the light-emitting signal based on the difference; and
outputting a driving signal to the semiconductor laser according to the expanded light-emitting signal.

* * * * *